US011309458B2

(12) United States Patent
Jung et al.

(10) Patent No.: US 11,309,458 B2
(45) Date of Patent: Apr. 19, 2022

(54) LIGHT-EMITTING DEVICE AND DISPLAY DEVICE USING THE SAME

(71) Applicant: LG Display Co., Ltd., Seoul (KR)

(72) Inventors: Taeil Jung, Goyang-si (KR); Il-Soo Kim, Goyang-si (KR); YongSeok Kwak, Paju-si (KR)

(73) Assignee: LG Display Co., Ltd, Seoul (KR)

( * ) Notice: Subject to any disclaimer, the term of this patent is extended or adjusted under 35 U.S.C. 154(b) by 57 days.

(21) Appl. No.: 16/878,215

(22) Filed: May 19, 2020

(65) Prior Publication Data

US 2020/0279975 A1 Sep. 3, 2020

Related U.S. Application Data

(62) Division of application No. 16/152,711, filed on Oct. 5, 2018, now Pat. No. 10,693,042.

(30) Foreign Application Priority Data

Nov. 23, 2017 (KR) .......................... 10-2017-0157688
Dec. 7, 2017 (KR) .......................... 10-2017-0167167

(51) Int. Cl.
*H01L 33/38* (2010.01)
*H01L 33/44* (2010.01)
(Continued)

(52) U.S. Cl.
CPC .......... *H01L 33/387* (2013.01); *H01L 25/167* (2013.01); *H01L 33/382* (2013.01);
(Continued)

(58) Field of Classification Search
CPC ............................ H01L 33/382; H01L 33/387
See application file for complete search history.

(56) References Cited

U.S. PATENT DOCUMENTS

2006/0157718 A1 7/2006 Seo et al.
2010/0270573 A1 10/2010 Hwang
(Continued)

FOREIGN PATENT DOCUMENTS

CN 101877380 A 11/2010
CN 103779473 A 5/2014
(Continued)

OTHER PUBLICATIONS

Office Action dated Dec. 3, 2020, issued in corresponding Chinese Patent Application No. 201811317325.7.
(Continued)

*Primary Examiner* — Farun Lu
(74) *Attorney, Agent, or Firm* — Morgan, Lewis & Bockius LLP

(57) ABSTRACT

A light-emitting device and a display device using the same. The light-emitting device improves the reliability of a process of disposing light-emitting devices. The light-emitting device is configured to ensure electrical connections even if the light-emitting device is inverted while being disposed on a substrate. The light-emitting device includes an n-type semiconductor layer and a p-type semiconductor layer. N-type electrodes and p-type electrodes are disposed on both sides of top and bottom surfaces of the light-emitting device. Contact holes are provided to electrically connect one of the n-type electrodes to the n-type semiconductor layer and one of the p-type electrodes to the p-type semiconductor layer. When the light-emitting device is inverted while being disposed on a substrate, the light-emitting device operates ordinarily, thereby reducing the defect rate of a display device.

11 Claims, 19 Drawing Sheets

(51) Int. Cl.
*H01L 25/16* (2006.01)
*H01L 33/14* (2010.01)
*H01L 33/32* (2010.01)

(52) U.S. Cl.
CPC ............ *H01L 33/385* (2013.01); *H01L 33/44* (2013.01); *H01L 33/14* (2013.01); *H01L 33/32* (2013.01)

(56) References Cited

U.S. PATENT DOCUMENTS

| | | |
|---|---|---|
| 2015/0053995 A1 | 2/2015 | Bae et al. |
| 2016/0013386 A1 | 1/2016 | Wang et al. |
| 2016/0099383 A1 | 4/2016 | Yuh |
| 2016/0126225 A1* | 5/2016 | Huang ................. H01L 27/156 257/91 |
| 2016/0126423 A1 | 5/2016 | Jung et al. |
| 2017/0324014 A1* | 11/2017 | Odnoblyudov ....... H01L 27/156 |
| 2019/0051793 A1 | 2/2019 | He et al. |

FOREIGN PATENT DOCUMENTS

| | | |
|---|---|---|
| CN | 107437542 A | 12/2017 |
| JP | 4273928 B2 | 6/2009 |
| JP | 5325197 B2 | 10/2013 |
| JP | 2015-513384 A | 5/2015 |
| KR | 10-2013-0062770 A | 6/2013 |
| KR | 10-2016-0041417 A | 4/2016 |
| KR | 10-2016-0050228 A | 5/2016 |
| KR | 10-2017-0038250 A | 4/2017 |
| KR | 10-2017-0122008 A | 11/2017 |

OTHER PUBLICATIONS

Office Action dated Jan. 21, 2022 issued by the Korean Intellectual Property Office in counterpart Korean Patent Application No. 10-2017-0167167.

* cited by examiner

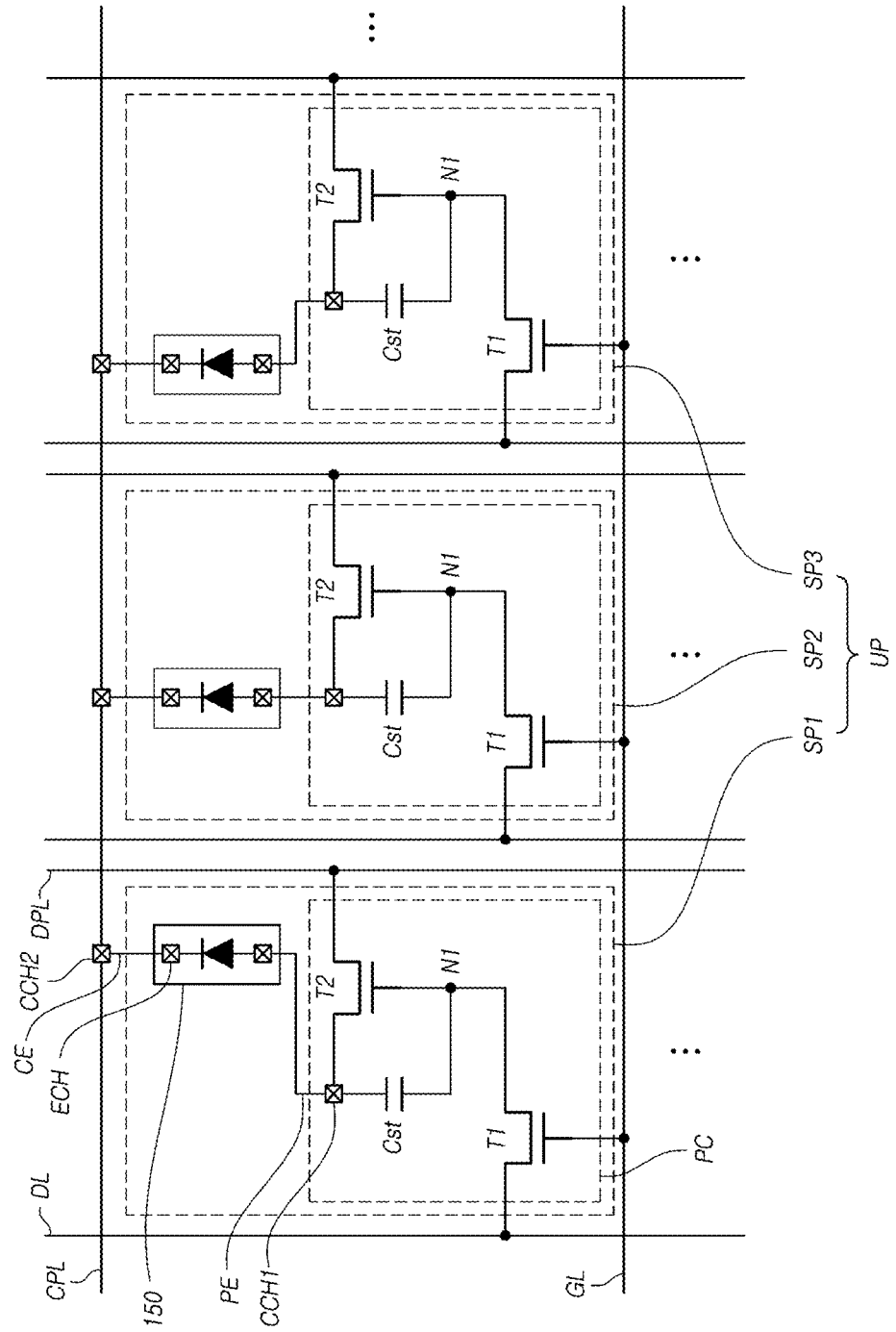

Case 1 Circuit Protection ESD

Case 2 Maximum Brightness, Luminance Compensation

Case 3 Pixel Repair

LIGHT-EMITTING DEVICE AND DISPLAY DEVICE USING THE SAME

CROSS REFERENCE TO RELATED APPLICATION

This application is a divisional of U.S. application Ser. No. 16/152,711, filed on Oct. 5, 2018, which claims priority from Korean Patent Application No. 10-2017-0157688, filed on Nov. 23, 2017, and Korean Patent Application No. 10-2017-0167167, filed on Dec. 7, 2017, which are hereby incorporated by reference for all purposes as if fully set forth herein.

BACKGROUND

Technical Field

The present disclosure relates to a light-emitting device and a display device using the same. More particularly, the present disclosure relates to a light-emitting device able to be more firmly disposed in place and a display device using the same.

Description of Related Art

Display devices are widely used not only as display screens for TVs or monitors, but also as display screens for notebook computers, tablet computers, smartphones, portable display devices, portable information devices, and the like.

Display devices may be divided into reflective display devices and light-emitting display devices. Reflective display devices display information by reflecting natural light or light radiated from an external lighting device, while light-emitting display devices display information using light emitted by a light-emitting device or a light source disposed therein.

Such a built-in light-emitting device may be implemented as a light-emitting device that can emit a variety of wavelengths of light, or may be implemented as a light-emitting device that can emit white or blue light, used together with a color filter able to change the wavelength of light.

A plurality of light-emitting devices, as described above, are disposed on the substrate of a display device to render an image, and driving devices for supplying driving signals or driving currents to control the light-emitting devices to individually emit light are disposed on the substrate, together with the light-emitting devices. The plurality of light-emitting devices, disposed on the substrate, are displayed on the substrate, based on the analysis of the arrangement of information to be displayed.

In other words, a plurality of pixels are displayed on the display device, and each of the pixels uses a thin-film transistor (TFT) as a switching device, i.e. a driving device, and is connected to the TFT to be driven thereby. Accordingly, the display device displays an image through the operation of each of the pixels.

Representative display devices using such TFTs may include liquid crystal display (LCD) devices and organic light-emitting display devices. An LCD device requires a backlight unit disposed to radiate light to the bottom surface (or rear surface) of the LCD device, since the LCD device does not emit light by itself. Due to such an additional backlight unit, the thickness of the LCD device may be increased, the ability of the display device to be provided with a variety of designs, such as a flexible structure or a circular profile, may be limited, and the luminance and response speed of the display device may be lowered.

In contrast, a display device including self-luminous devices may be provided to be thinner than a display device including a light source therein and may be provided as a flexible and foldable display device, which are advantageous.

Display devices having self-luminous devices, as described above, may include organic light-emitting display devices including an organic material as a light-emitting layer, micro-LED display devices using microscopic LED devices as light-emitting devices, and the like. Self-luminous display devices, such as organic light-emitting display devices and micro-LED display devices, may be used as display devices having thinner shapes or a greater variety of shapes, since no separate light sources are required.

Although organic light-emitting display devices using an organic material are free from separate light sources, they are vulnerable to defective pixels, caused by, for example, oxidation between an organic light-emitting layer and electrodes due to the penetration of moisture and oxygen. Accordingly, a variety of technical measures are additionally required to reduce the penetration of oxygen and moisture.

Regarding the above-described problems, recently, research and development have been undertaken to realize display devices using microscopic light-emitting diodes (hereinafter referred to as "micro-LED devices") as light-emitting devices. Display devices using micro-LED devices have been prominent as next-generation display devices, since such display devices have high quality and high reliability.

LED devices are semiconductor light-emitting devices based on the property of emitting light in response to current supplied to a semiconductor, and are widely used in lighting devices, TVs, a variety of display devices, and the like. An LED device includes an n-type semiconductor layer, a p-type semiconductor layer, and an active layer disposed between the n-type semiconductor and p-type semiconductor layers. When current is supplied, electrons migrating from the n-type semiconductor layer and holes migrating from the p-type semiconductor layer are recombined in the active layer, thereby generating light.

An LED device is made of a compound semiconductor, such as GaN, to be able to realize high luminosity, since a high current can be induced due to the characteristics of the inorganic material. An LED device also has high reliability, since the inorganic material is resistant to environmental factors, such as heat, moisture, and oxygen.

In addition, an LED device can display high-luminosity images, due to the internal quantum efficiency thereof on the order of 90%, which is higher than that of organic light-emitting display devices, while providing a display device consuming a lower amount of power.

Furthermore, unlike organic light-emitting devices, an LED device is insignificantly influenced by oxygen and moisture, since the LED device uses an inorganic material. In addition, since a separate encapsulation film or substrate for minimizing the penetration of oxygen and moisture is unnecessary, it is possible to advantageously reduce the inactive area, i.e., a marginal area, of a display device, which would otherwise be formed by the provision of the encapsulation film or the encapsulation substrate.

However, a light-emitting device, such as an LED device, may require a procedure of, for example, being transplanted to a display device after being fabricated using a separate semiconductor substrate. To provide a display device having the above-described advantages, technical solutions for accurately disposing the light-emitting device in position in the display device, as well as technical solutions able to reduce errors that would occur while disposing the light-emitting device, are required. There is a variety of ongoing research into such technical solutions.

SUMMARY

To provide a light-emitting display device using light-emitting diode (LED) devices as light-emitting devices in unit pixels, as described above, some technical solutions are required. First, a plurality of LED devices are provided on a semiconductor wafer made of sapphire, silicon (Si), or the like, by crystallization, and then the plurality of LED devices are transferred to a substrate on which driving devices are disposed. Here, a precise transfer process of locating the LED devices in positions corresponding to pixels is required.

Although LED devices may be fabricated using an inorganic material, the inorganic material must be crystallized. To crystallize an inorganic material, such as GaN, the inorganic material must be crystallized on a substrate able to induce crystallization. Such a substrate, able to efficiently induce the crystallization of an inorganic material, is a semiconductor substrate. As described above, the inorganic material must be crystallized on the semiconductor substrate.

The process of crystallizing LED devices is referred to as epitaxy, epitaxial growth, or an epitaxial process. The epitaxial process means growth in a specific orientation on the surface of a specific crystalline substrate. To form a device structure of an LED device, a GaN-based compound semiconductor must be layered on the substrate, in the shape of a p-n junction diode. In this case, during the growth of layers, the crystallinity of each layer is locked to the crystallinity of the underlying layer.

In the electron-hole recombination process, defects in the crystal act as non-radiative centers. Thus, in an LED device using photons, the crystallinity of each layer has a decisive effect on the efficiency of LED device.

Currently, sapphire is mainly used for substrates such as those described above, and research activities into GaN-based substrates are being actively undertaken.

Because of highly expensive semiconductor substrates used to crystallize an inorganic material such as GaN, using a large number of LEDs as light-generating pixels of a display device, rather than using a simple lighting device or a backlight unit, may increase fabrication costs, which is problematic.

In addition, LED devices provided on a semiconductor substrate are required to be transferred to a substrate of a display device, as described above. In this transfer process, it may be difficult to separate LED devices from the semiconductor substrate. In addition, there may be significant difficulties in transplanting the separated LED devices properly in intended locations.

Methods of transferring LED devices, fabricated on a semiconductor substrate, to a substrate of a display device may include a method of using a transfer substrate made of a polymer material, such as polydimethylsiloxane (PDMS), a transferring method using electromagnetism or static electricity, a method of physically transferring LED devices one by one, and the like.

The transfer process is related to the productivity of the process of providing a display device, and the method of transferring LED devices one by one is inefficient in terms of mass production.

Accordingly, a precise transfer process or method is required in the process of properly locating a plurality of LED devices on a substrate of a display device (hereinafter referred to as a "display device substrate"), more particularly, on pad electrodes connected to driving devices and power electrodes disposed on thin-film transistors (TFTs), by separating the plurality of LED devices from a semiconductor substrate using a transfer substrate made of a polymer material.

In the above-described transfer process or a process subsequent to the transfer process, defects may occur in LED devices, i.e., LED devices may be inverted due to process conditions, such as vibrations or heat, while being moved or transferred. It is significantly difficult to find and repair such defects.

Defects that would occur in the case that LED devices were not properly located in the transfer process will be described in more detail by way of example of a typical transfer process, as follows:

First, individual LED devices are produced by forming LED devices on a semiconductor substrate and then forming electrodes. Afterwards, a PDMS substrate (hereinafter referred to as a "transfer substrate") is brought into contact with the semiconductor substrate. Since distances equal to pixel pitches must be considered when transferring the LED devices from the semiconductor substrate, on which the LED devices are fabricated, to the transfer substrate, protrusions or the like protrude from the transfer substrate to support the LED devices in consideration of the pixel pitches.

Thereafter, the LED devices are separated from the semiconductor substrate by irradiating laser beams onto the LED devices from the rear side of the semiconductor substrate. During the separation of the LED devices from the semiconductor substrate by the laser irradiation process, the GaN material of the semiconductor substrate may be subjected to rapid physical expansion due to energy concentration caused by high-energy laser beams, thereby generating impacts. Due to such impacts or the like, when the LED devices are transferred to the transfer substrate (hereinafter referred to as a "first transfer process"), the LED devices may be inverted or laterally misplaced.

In subsequence, the LED devices are transferred from the transfer substrate to a display device substrate. In the display device substrate, a protective layer is provided on areas of the substrate, in which TFTs are disposed, to insulate and protect the TFTs, and an adhesion layer is provided on the protective layer.

When the transfer substrate and the display device substrate are brought into contact with each other and heat is applied to the substrates, the LED devices are transferred from the transfer substrate to the display device substrate by the adhesion layer on the protective layer.

Here, the degree of adhesion between the transfer substrate and the LED devices is set to be lower than the degree of adhesion between the display device substrate and the LED substrates, so that the LED substrates can be transferred from the transfer substrate to the display device substrate (hereinafter referred to as a "second transfer process").

The semiconductor substrate and the display device substrate typically have different sizes, and the display device substrate generally has a greater area than the semiconductor substrate. Because of such differences in area and size, the above-described first transfer and second transfer processes may be repeatedly undertaken on respective regions of the display device substrate to transfer the entirety of LED devices to a display device.

The LED devices provided on the semiconductor substrate may be red, blue, and green LED devices, depending on types thereof, or may be white LED devices. In a process of providing pixels of a display device using LED devices generating different wavelengths of light, the number of the first transfer and second transfer processes may be further increased.

An LED device is a typical p-n junction diode, in which current must flow in a specific direction due to the characteristics of the diode, and light is generated by electroluminescence based on electron-hole recombination, generally when a forward bias is applied. Since the p-n junction directly converts the energy of electrons into light, macroscopic heat or kinetic energy is not necessary. Electrons and holes, injected into a semiconductor from electrodes, move through different energy bands (i.e. a conduction band and a valence band) and jump a band gap, in locations adjacent to a p-n junction, thereby recombining with each other. In the recombination, energy substantially equal to band-gap energy is emitted as photons, i.e. light.

As described above, LED devices may be inverted or misoriented during the first transfer process and the second transfer process. This may increase defective pixels in a display device, thereby increasing fabrication costs thereof, which is problematic. In this regard, the inventors invented a light-emitting device able to be more firmly disposed in place and a display device using the same.

In a reverse bias state, a band gap is further increased by depletion, i.e., a phenomenon in which electrons and holes are diffused away. However, when a reverse bias is significantly increased, i.e., is increased to a yield voltage, tunneling occurs in the p-n junction, so that current can flow. However, at this time, due to a sudden flow of current, TFTs, including LED devices, may be damaged. In this regard, the inventors invented a light-emitting device able to reduce damage in the light-emitting device and a driving device even if an irregular flow of current, such as static electricity, occurs, and a display device using the same.

Accordingly, embodiments of the present disclosure are directed to a light-emitting device and a display device using the same that substantially obviate one or more of the problems due to limitations and disadvantages of the related art.

An aspects of the present disclosure is to provide a light-emitting device and a display device using the same, the light-emitting device being able to achieve an electrical connection even if the light-emitting device is misoriented while being disposed on a substrate.

Another aspect of the present disclosure is to provide a light-emitting device and a display device using the same, wherein the light-emitting device can achieve an electrical connection even if the light-emitting device is inverted while being transferred to a substrate, thereby minimizing the defect rate of the display device.

Another aspect of the present disclosure is to provide a light-emitting device and a display device using the same, wherein the light-emitting device can reduce damage in the light-emitting device and a driving device when abnormal current, such as static electricity, occurs.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a light-emitting device able to be more firmly disposed in place and a display device using the same are provided. The light-emitting device may comprise an n-type semiconductor layer; a p-type semiconductor layer; an active layer, wherein the n-type semiconductor layer and the p-type semiconductor layer are disposed on both sides of the active layer; and N-type electrodes and p-type electrodes disposed on both sides of top and bottom surfaces of the light-emitting device such that an electrical connection is provided even in the case in which the light-emitting device is inverted while being disposed on a substrate. An n-type electrode, located on the n-type semiconductor layer, of the n-type electrodes, is connected to the n-type semiconductor layer by direct contact therewith. A p-type electrode, located on the n-type semiconductor layer, of the p-type electrodes, is connected to the p-type semiconductor layer by extending so as to be insulated from the n-type semiconductor layer. The p-type electrode located on the n-type semiconductor layer is in contact with and electrically connected to the p-type semiconductor layer by extending through a contact hole in the n-type semiconductor layer or by bypassing the n-type semiconductor layer. A p-type electrode, located on the p-type semiconductor layer, of the p-type electrodes, is connected to the p-type semiconductor layer by direct contact therewith. In addition, an n-type electrode, located on the p-type semiconductor layer, of the n-type electrodes, is insulated from the p-type semiconductor layer, and is in contact with and electrically connected to the n-type semiconductor layer by extending through a contact hole in the p-type semiconductor layer or by bypassing the p-type semiconductor layer.

Since the n-type electrodes and the p-type electrodes are disposed on the n-type semiconductor layer and the p-type semiconductor layer of the light-emitting device, even in the case in which the light-emitting device is inverted while being disposed on the substrate, electrical connections can be reliably provided. This can accordingly reduce the defect rate of a transfer process used in the fabrication of a display device, thereby minimizing the defect rate of the display device.

Also provided are a light-emitting device able to reduce damage when abnormal current occurs, and a display device using the same. The light-emitting device may include a p-type semiconductor layer, an active layer, and an n-type semiconductor layer sequentially layered on a substrate. At least one p-type electrode is disposed on the p-type semiconductor layer, while an at least one n-type electrode is disposed on the n-type semiconductor layer. The p-type semiconductor layer includes a first p-type semiconductor layer, a second p-type semiconductor layer, and a first wall by which the first and second p-type semiconductor layers are divided from each other, while the n-type semiconductor layer includes a first n-type semiconductor layer, a second n-type semiconductor layer, and a second wall by which the first and second n-type semiconductor layers are divided from each other. The second n-type semiconductor layer, of the first and second n-type semiconductor layers divided by the first wall, is insulated from the n-type electrode, and at least one first contact hole is provided in the second n-type semiconductor layer to electrically connect the second n-type semiconductor layer to the second p-type semiconductor layer. The second p-type semiconductor layer, of the first and second p-type semiconductor layers divided by the second wall, is insulated from the p-type electrode, and a second contact hole is provided in the second p-type semiconductor layer to electrically connect the second p-type semiconductor layer to the second n-type semiconductor layer. When electrons and holes are supplied to the n-type electrode and the p-type electrode as described above, a forward bias is applied to the first n-type semiconductor layer and the first p-type semiconductor layer while a reverse bias is applied to the second n-type semiconductor layer and the second p-type semiconductor layer.

As described above, the first and second n-type and p-type semiconductor layers operate regardless of the top portion and the bottom portion of the light-emitting device in order to block current in response to a reverse bias and recombine electrons and holes in response to a forward bias. Accordingly, light-emitting device can provide a light emitting function and a protection function while minimizing damage due to abnormal current.

According to exemplary embodiments, a light-emitting device may reduce defects caused by the process of disposing the light-emitting device is used. This can consequently reduce defects in a display device that would otherwise occur in the process of displaying light-emitting devices, thereby improving productivity. In addition, the use of the above-described light-emitting device can improve processing convenience.

According to exemplary embodiments, the use of a light-emitting device able to reduce damage in light-emitting devices and a driving device can improve the reliability of longevity and the reliability of products.

The effects according to exemplary embodiments are not limited to the above description, and other effects not explicitly disclosed herein will be clearly understood by a person skilled in the art from the description provided hereinafter.

The aforementioned description, regarding objects, solutions for realizing the objects, and effects, does not specify the essential features of the appended claims and the scope of the claims is not limited by the description provided hereinafter.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings:

FIGS. 2A and 2B are schematic circuit diagrams illustrating configurations of the unit pixels according to an exemplary embodiment, illustrated in FIG. 1;

DETAILED DESCRIPTION

Figure 1:
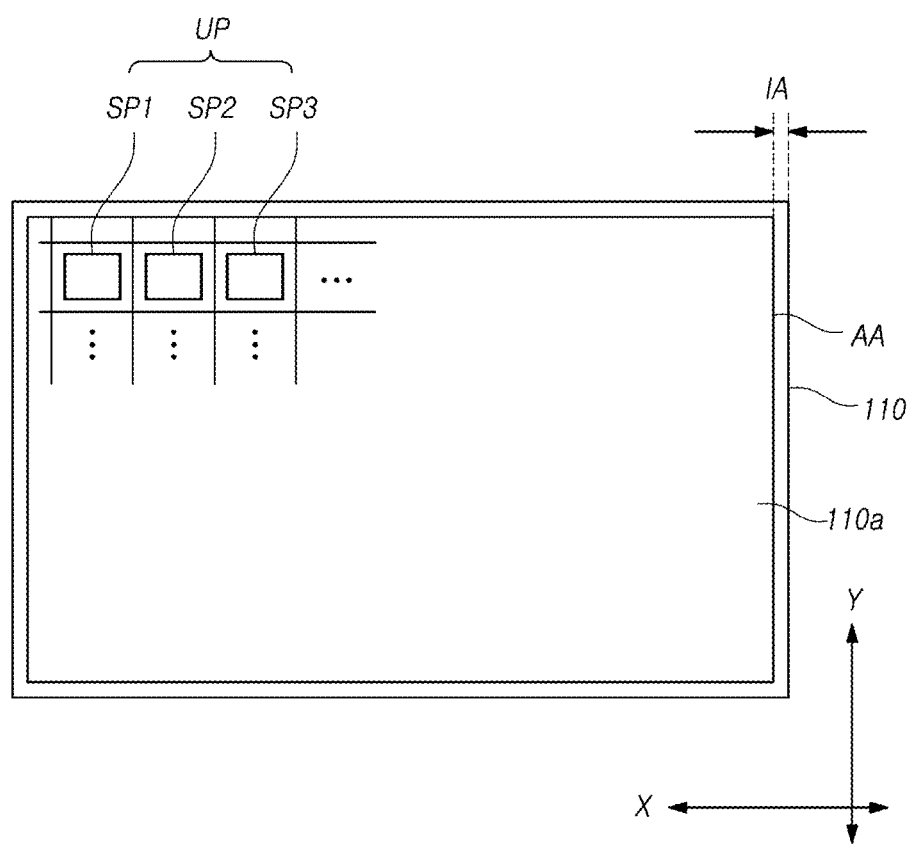
FIG. 1 is a schematic top view illustrating a light-emitting display device according to an exemplary embodiment.

The advantages and features of the present disclosure and measures for the realization thereof will be apparent with reference to the accompanying drawings and detailed descriptions of the embodiments. The present disclosure should not be construed as being limited to the embodiments set forth herein and may be embodied in many different forms. Rather, these embodiments are provided so that the present disclosure will be thorough and complete, and will fully convey the scope of the present disclosure to a person skilled in the art. The scope of the present disclosure shall be defined by the appended Claims.

The shapes, sizes, ratios, angles, numbers, and the like, inscribed in the drawings to illustrate exemplary embodiments are illustrative only, and the present disclosure is not limited to the embodiments illustrated in the drawings. Throughout this document, the same reference numerals and symbols will be used to designate the same or like components.

In the following description of the present disclosure, detailed descriptions of known functions and components incorporated herein will be omitted in the case that the subject matter of the present disclosure may be rendered unclear thereby. It will be understood that the terms "comprise," "include," "have," and any variations thereof used herein are intended to cover non-exclusive inclusions unless explicitly described to the contrary. Descriptions of components in a singular form are intended to include descriptions of components in a plural form, unless explicitly described to the contrary.

In the analysis of a component, it shall be understood that an error range is included therein, even in the case in which there is no explicit description thereof.

When spatially relative terms, such as "on," "above," "under," "below," and "on a side of," are used herein for descriptions of relationships between one element or component and another element or component, one or more intervening elements or components may be present between the one and another elements or components, unless a term, such as "directly," is used.

When temporally relative terms, such as "after," "subsequent," "following," and "before" are used to define a temporal relationship, a non-continuous case may be included unless the term "directly" is used.

In a description regarding a signal flow, for example, an expression "a signal is transferred from node A to node B" may include a case in which a signal is transferred from node A to node B via another node unless a term, such as "directly," is used.

In addition, terms, such as "first" and "second" may be used herein to describe a variety of components. It should be understood, however, that these components are not limited by these terms. These terms are merely used to discriminate one element or component from another element or component. Thus, a first element referred to as first hereinafter may be a second element within the spirit of the present disclosure.

The features of a plurality of exemplary embodiments may be partially or entirely united or combined, may work in concert with each other, or may be driven by a variety of technical methods. In addition, respective exemplary embodiments may be carried out independently of each other or may be carried out in concert with other embodiments.

Hereinafter, a variety of exemplary embodiments will be described in detail with reference to the accompanying drawings.

Figure 2A:
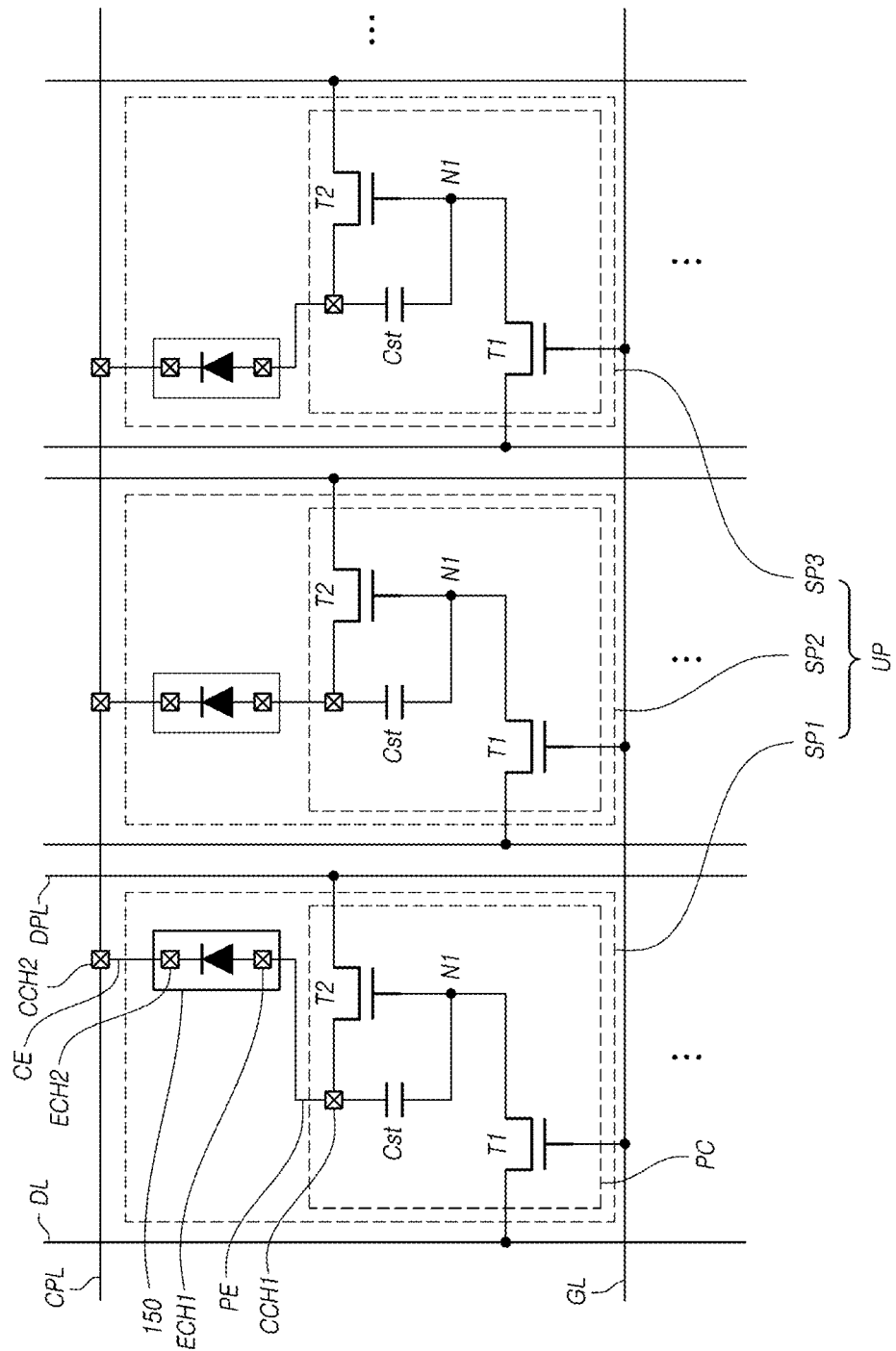

FIG. 1 is a schematic top view illustrating a light-emitting display device according to an exemplary embodiment, and FIGS. 2A and 2B are schematic circuit diagrams illustrating configurations of unit pixels according to an exemplary embodiment, illustrated in FIG. 1. With reference to FIGS. 1, 2A, and 2B, the light-emitting display device 100 according to an exemplary embodiment includes a substrate 110 on which an active area AA and an inactive area IA are defined. In the active area AA, a plurality of unit pixels UP are located.

Each of the unit pixels UP may be comprised of a plurality of subpixels SP1, SP2, and SP3, located on the front surface 110a of the substrate 110. The subpixels SP1, SP2, and SP3 may typically be, but are not limited to, subpixels emitting red, blue, and green wavelengths of light. Each of the unit pixels UP may include a subpixel emitting white light or the like.

The substrate 110 is a thin-film-transistor (TFT) array substrate, which may be made of glass or plastic. The substrate 110 may be a substrate comprised of two or more substrates bonded to each other or a substrate comprised of two or more distinct layers. The inactive area IA may be defined as an area on the substrate 110, except for the active area AA, having a very small width. The inactive area IA may be defined as a bezel area.

Each of the plurality of unit pixels UP is disposed in the active area AA. Each of the plurality of unit pixels UP is disposed in the active area AA to have a predetermined first reference pixel pitch in the X-axial direction and a predetermined second reference pixel pitch in the Y-axial direction. The first reference pixel pitch may be defined as a distance between the centers of adjacent unit pixels UP, while the second reference pitch may be defined as a distance between the centers of unit pixels UP, disposed adjacently to each other in the reference direction, like the first reference pixel pitch.

In addition, distances between the subpixels SP1, SP2, and SP3 of each of the unit pixels UP may be defined using a first reference subpixel pitch and a second reference subpixel pitch, like the first reference pixel pitch and the second reference pixel pitch.

In the light-emitting display device 100 including light-emitting diode (LED) devices (or light-emitting devices) 150, the width of the inactive area IA may be narrower than the above-described pixel pitch or subpixel pitch (distance between pixels or subpixels). When a multi-screen display device is provided using the light-emitting display device 100 having the inactive area IA, the width of which is equal to or narrower than the pixel pitch or subpixel pitch, the multi-screen display device may have substantially no bezel area, since the width of the inactive area IA is equal to or narrower than the pixel pitch or subpixel pitch.

To provide the multi-screen display device having substantially no or a minimized bezel area, the light-emitting display device 100 may be configured such that the first reference pixel pitch, the second reference pixel pitch, the first reference subpixel pitch, and the second reference subpixel pitch within the active area AA may be maintained to be uniform. The active area AA may be comprised of a plurality of regions, with pitch lengths in the regions being different from each other. The pixel pitch of a region adjacent to the inactive area IA may be set to be greater than the pitch of the other regions, such that the width of the bezel area is further narrower than the pixel pitch.

The light-emitting display device 100 having different pixel pitches, as described above, may suffer from image distortion. Accordingly, it is possible to reduce the bezel area while minimizing image distortion by performing image processing in which image data is sampled, in comparison with adjacent regions, in consideration of the set pixel pitches.

However, when minimizing the inactive area IA, for each of the unit pixels UP in which the LED device 150 is located, a pad area for connection to a circuit portion for power supply and the transmission and/or reception of a data signal and a minimum area for driver ICs are required.

The configurations and circuit structures of the subpixels SP1, SP2, and SP3 of the unit pixel UP of the light-emitting display device 100 will be described with reference to FIGS. 2A and 2B. Pixel driving lines are provided on the front surface 110a of the substrate 110 to supply necessary signals to the plurality of subpixels SP1, SP2, and SP3. The pixel driving lines according to an exemplary embodiment include a plurality of gate lines GL, a plurality of data lines DL, a plurality of driving power lines DPL, and a plurality of common power lines CPL.

The plurality of gate lines GL are provided on the front surface of the substrate 110 to extend in a first horizontal X-axial direction of the substrate and to be spaced apart from each other at constant distances in a second horizontal Y-axial direction.

The plurality of data lines DL are provided on the front surface 110a of the substrate 110 to intersect the plurality of gate lines GL. The plurality of data lines DL extend in the second horizontal Y-axial direction while being spaced apart from each other at a constant distance in the first horizontal X-axial direction.

The plurality of driving power lines DPL are provided on the substrate 110 to be parallel to the plurality of data lines DL, respectively. Each of the plurality of driving power lines DPL supplies pixel driving power, supplied from an external source, to subpixels, among the plurality of subpixels SP, located adjacently thereto.

The plurality of common driving power lines CPL are provided on the substrate 110 to be parallel to the plurality of gate lines GL, respectively, and may be formed together with the plurality of gate lines GL, respectively. Each of the plurality of common driving power lines CPL supplies common power, provided from an external source, to subpixels, among the plurality of subpixels SP1, SP2, and SP3, located adjacently thereto.

Each of the plurality of subpixels SP1, SP2, and SP3 is provided in a subpixel area, among a plurality of subpixel areas defined by the gate lines GL and the data lines DL, corresponding thereto. Each of the plurality of subpixels SP1, SP2, and SP3 may be defined as a minimum unit area from which light is actually emitted.

At least three subpixels SP1, SP2, SP3, among the plurality of subpixels, located adjacently to each other, may constitute a single unit pixel UP. For example, a single unit pixel UP includes a red subpixel SP1, a green subpixel SP2, and a blue subpixel SP3, located adjacently to each other in the first horizontal X-axial direction. The single unit pixel UP may further include a white subpixel to improve the level of brightness.

Optionally, each of the plurality of driving power lines DPL may be provided for a single unit pixel, among the plurality of unit pixels UP, corresponding thereto. In this case, at least three subpixels SP1, SP2, and SP3 constituting each unit pixel UP share a single driving power line DPL. Accordingly, the number of driving power lines for the driving of the subpixels SP1, SP2, and SP3 can be reduced. In addition, the aperture ratio of each unit pixel UP may be increased, or the size of each unit pixel UP may be reduced, by a degree corresponding to the number of the reduced driving power lines.

Each of the plurality of subpixels SP1, SP2, and SP3 according to an exemplary embodiment includes a pixel circuit PC and an LED device 150.

The pixel circuit PC is provided in a circuit area defined in each of the subpixels SP to be connected to a gate line, a data line, and a driving power line, among the plurality of gate, data, and driving power lines GL, DL, and DPL, located adjacently thereto. The pixel circuit PC controls current flowing in the LED device 150 following a data signal from the data line DL in response to a scanning pulse from the gate line GL, based on pixel driving power supplied from the driving power line DPL. The pixel circuit PC according to an exemplary embodiment includes a switching thin-film transistor T1, a driving thin-film transistor T2, and a capacitor Cst.

The switching thin-film transistor T1 includes a gate electrode connected to the gate line GL, a first electrode connected to the data line DL, and a second electrode connected to a gate electrode N1 of the driving thin-film transistor T2. Here, the first electrode and the second electrode of the switching thin-film transistor T1 may be a source electrode and a drain electrode or a drain electrode and a source electrode, respectively, depending on the direction of current. The switching thin-film transistor T1 is switched by a scanning pulse supplied to the gate line GL to direct a data signal from the data line DL to the driving thin-film transistor T2.

The driving thin-film transistor T2 is turned on by at least one of a voltage supplied from the switching thin-film transistor T1 and a voltage supplied of the capacitor Cst to control the amount of current flowing from the driving power line DPL to the LED device 150. In this regard, the driving thin-film transistor T2 according to an exemplary embodiment includes a gate electrode connected to the second electrode N1 of the switching thin-film transistor T1, a drain electrode connected to the driving power line DPL, and a source electrode connected to the driving power line DPL. The driving thin-film transistor T2 controls data current flowing from the driving power line DPL to the LED device 150, based on data signals supplied from the switching thin-film transistor T1, thereby controlling the light emission of the LED device 150.

The capacitor Cst is provided in an overlapping area of the gate electrode N1 and a source electrode of the driving thin-film transistor T2 to store a voltage corresponding to a data signal supplied to a gate electrode of the driving thin-film transistor T2 and to turn on the driving thin-film transistor T2 using the stored voltage.

Optionally, the pixel circuit PC may further include at least one compensation thin-film transistor for compensating a variation in the threshold voltage of the driving thin-film transistor T2, and furthermore, at least one auxiliary capacitor. The pixel circuit PC may be additionally supplied with compensation power, such as an initialization voltage, depending on the number of thin-film transistors and the number of auxiliary capacitors. Since the pixel circuit PC according to an exemplary embodiment drives the LED device 150 using the same current driving method as in each of subpixels of an organic light-emitting display device, as described above, the pixel circuit PC may be changed into a pixel circuit of a known organic light-emitting display device.

The LED device 150 is mounted in each of the plurality of subpixels SP1, SP2, and SP3. The LED device 150 is electrically connected to the pixel circuit PC of the corresponding subpixel SP and the common power line CPL, thereby emitting light in response to current flowing from the pixel circuit PC, i.e. the driving thin-film transistor T2, to the common power line CPL. The LED device 150 according to an exemplary embodiment may be a light device or an LED device emitting red, green, blue, or white light. The LED device may have, but is not limited to, a scale of 1 µm to 100 µm. The LED device may have a scale or size smaller than the size of a light-emitting area, among the subpixel area, except for a circuit area occupied by the pixel circuit PC.

Figure 3A:
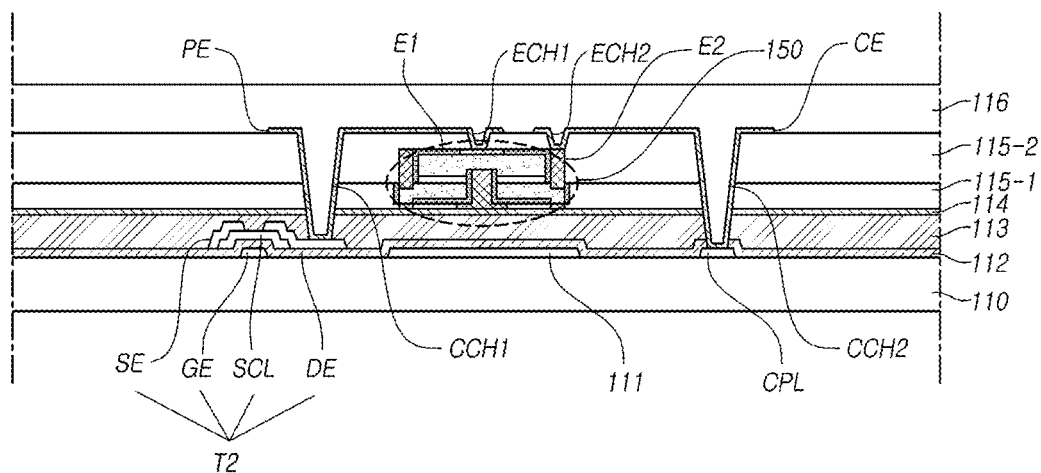
FIGS. 3A and 3B are schematic cross-sectional views illustrating a display device including a light-emitting device according to exemplary embodiments.
Figure 3B:
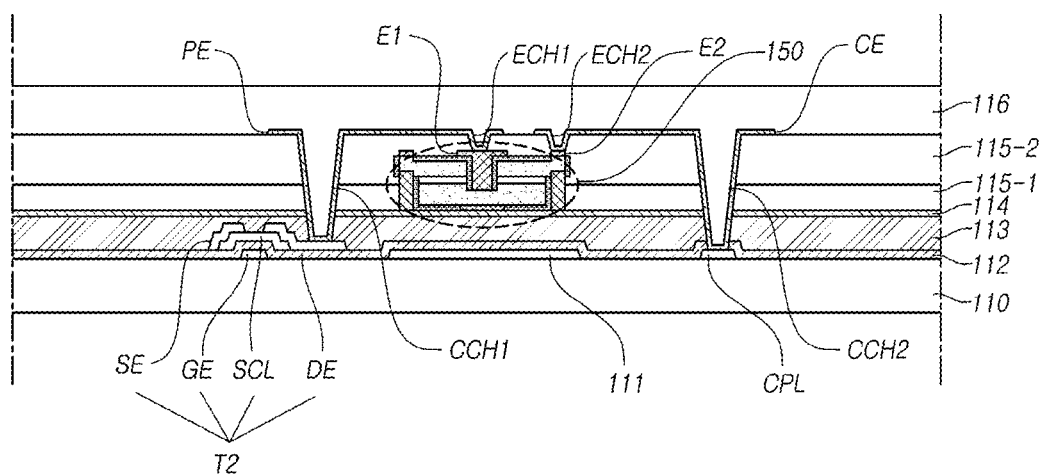

FIGS. 3A and 3B are schematic cross-sectional views illustrating a display device according to exemplary embodiments.

The following description will be provided with reference to FIGS. 3A and 3B, in conjunction with the foregoing drawings.

Each of the subpixels SP1, SP2, and SP3 of the display device according to an exemplary embodiment includes a protective layer 113, an LED device 150, a planarization layer 115-1 and 115-2, a pixel electrode PE, and a common electrode CE.

Although the substrate 110 is illustrated as being relatively thin in FIGS. 3A and 3B, the thickness of the substrate 110 may be greater than the thickness of an entire layer structure provided on the substrate 110. The substrate 110 may be a substrate comprised of a plurality of layers or a plurality of substrates bonded to each other.

The pixel circuit PC includes a switching thin-film transistor T1, a driving thin-film transistor T2, and a capacitor Cs. Since the features of the pixel circuit PC are the same as described above, a detailed description thereof will be omitted. Hereinafter, an exemplary structure of the driving thin-film transistor T2 will be described.

The driving thin-film transistor T2 includes a gate electrode GE, a semiconductor layer SCL, a source electrode SE, and a drain electrode DE.

The gate electrode GE is disposed on the substrate 110, together with a gate line GL. The gate electrode GE is covered with a gate insulating layer 112. The gate insulating layer 112 may be a single layer or a plurality of layers made of an inorganic material, such as a silicon oxide (SiOx) or a silicon nitride (SiNx).

The semiconductor layer SCL is provided in a predetermined pattern (or island) on the insulating layer 112 to overlap the gate electrode GE. The semiconductor layer SCL may be made of a semiconductor material selected from among, but not limited to, amorphous silicon, polycrystalline silicon, oxides, and an organic material.

The source electrode SE is disposed to overlap a peripheral portion of the semiconductor layer SCL. The source electrode SE is disposed together with the data line DL and the driving power line DPL.

The drain electrode DE is disposed to be spaced apart from the source electrode SE while overlapping a peripheral portion of the semiconductor layer SCL, opposite to the portion that the source electrode SE overlaps. The drain electrode DE is disposed together with the source electrode SE, branching or protruding from the adjacent driving power line DPL.

As an additional configuration, the switching thin-film transistor T1 of the pixel circuit PC has the same structure as the driving thin-film transistor T2. Here, the gate electrode of the switching thin-film transistor T1 branches or protrudes from the gate line GL, the first electrode of the switching thin-film transistor T1 branches or protrudes from the data line DL, and the second electrode of the switching thin-film transistor T1 is connected to the gate electrode GE of the driving thin-film transistor T2 through a via-hole provided in the insulating layer 112.

The protective layer 113 is provided above the entire surface of the substrate 110 to cover the subpixel SP, i.e. the pixel circuit PC. The protective layer 113 provides a planarization layer while protecting the pixel circuit PC. The protective layer according to an exemplary embodiment may be made of an organic material, such as benzocyclobutene or photo acrylic. In particular, the protective layer may be made of a photo acrylic material for processing convenience.

In the LED device 150 according to an exemplary embodiment, a bonding material 114 may be disposed on the protective layer 113. Alternatively, the bonding material 114 may be disposed in a recess provided in the protective layer 113. An inclined surface of the recess in the protective layer 113 may serve to cause light, emitted from the LED device 150, to travel in a specific direction, thereby improving light emission efficiency.

The LED device 150 is electrically connected to the pixel circuit PC and the common power line CPL to emit light in response to current flowing from the pixel circuit PC, i.e. the driving thin-film transistor T2, to the common power line CPL. The LED device 150 according to an exemplary embodiment includes a light-emitting (or electroluminescent) layer EL, first electrodes (or anode terminals) El, and second electrodes (or cathode terminals) E2.

The LED device 150 emits light due to electron-hole recombination along with current flowing between the first electrodes E1 and the second electrodes E2.

The planarization layer 115-1 and 115-2 is disposed above the protective layer 113 to cover the LED device 150. Specifically, the planarization layer 115-1 and 115-2 is disposed above the protective layer 113 at a thickness sufficient to cover the entire front surface of the protective layer 113, i.e. the area in which the LED device 150 is disposed and the remaining area of the front surface.

The planarization layer 115-1 and 115-2 may be provided as a single layer, and as illustrated in the drawings, may be a multilayer planarization layer 115-1 and 115-2 comprised of a first planarization layer 115-1 and a second planarization layer 115-2.

The planarization layer 115-1 and 115-2 provides a flat surface above the protective layer 113. The planarization layer 115-1 and 115-2 also serves to fix the position of the LED device 150.

The pixel electrode PE is configured to connect the first electrodes E1 of the LED device 150 to the drain electrode DE of the driving thin-film transistor T2. The pixel electrode PE may be configured to connect one of the first electrodes E1 of the LED device 150 to the source electrode SE, depending on the configuration of the thin-film transistor T2. The pixel electrode PE may be defined as an anode. The pixel electrode PE according to an exemplary embodiment is provided on a portion of the front surface of the planarization layer 115-1 and 115-2 to overlap the first electrodes E1 of the LED device 150 and the driving thin-film transistor T2. The pixel electrode PE is electrically connected to the drain electrode DE or the source electrode SE of the driving thin-film transistor T2 through a first circuit contact hole CCH1 extending through the protective layer 113 and the planarization layer 115-1 and 115-2, and is electrically connected to one of the first electrodes E1 of the LED device 150 through a first electrode contact hole ECH1 extending through the planarization layer 115-1 and 115-2. Accordingly, one of the first electrodes E1 of the LED device 150 is electrically connected to the drain electrode DE or the source electrode SE of the driving thin-film transistor T2 via the pixel electrode PE.

Regarding the connection to the source electrode SE and the drain electrode DE, the drain electrode DE and the pixel electrode PE are illustrated as being connected to each other, but the pixel electrode PE and the source electrode SE may be connected to each other. A configuration regarding the connection may be selected by a person having ordinary skill in the art.

The pixel electrode PE may be made of a transparent conductive material when the LED display device has a top emission structure or may be made of a light-reflecting conductive material when the LED display device is a bottom emission type device. The transparent conductive material may be, but is not limited to, indium tin oxide (ITO) or indium zinc oxide (IZO). The light-reflecting conductive material may be one selected from among, but is not limited to, Al, Ag, Au, Pt, and Cu. The pixel electrode PE made of a light-reflecting conductive material may be provided as a single layer containing the light-reflecting conductive material or a multilayer structure containing multiple single layers.

The common electrode CE electrically connects one of the second electrodes E2 of the LED device 150 to the common power line CPL. The common electrode CE may be defined as a cathode. The common electrode CE is provided on a portion of the front surface of the planarization layer 115-1 and 115-2 to overlap the second electrodes E2 of the LED device 150 and the common power line CPL. Here, the common electrode CE may be made of the same material as the pixel electrode PE.

One portion of the common electrode CE according to an exemplary embodiment is electrically connected to the common power line CPL through a second circuit contact hole CCH2 while overlapping the common power line CPL. The second circuit contact hole CCH2 extends through the insulating layer 112, the protective layer 113, and the planarization layer 115-1 and 115-2. The other portion of the common electrode CE according to an exemplary embodiment is electrically connected to one of the second electrodes E2 of the LED device 150 through a second electrode contact hole ECH2 to overlap the second electrodes E2 of the LED device 150. The second electrode contact hole ECH2 is provided in the planarization layer 115-1 and 115-2. Accordingly, one of the second electrodes E2 of the LED device 150 is electrically connected to the common power line CPL via the common electrode CE.

The pixel electrode PE and the common electrode CE according to an exemplary embodiment may be simultaneously provided in a deposition process of depositing an electrode material on the planarization layer 115-1 and 115-2 having the first and second circuit contact holes CCH1 and CCH2 and the first and second contact holes ECH1 and ECH2, a photolithography process, and an electrode patterning process using etching. As described above, according to an exemplary embodiment, the pixel electrode PE and the common electrode CE, by which the LED device 150 is connected to the pixel circuit PC, can be simultaneously provided to simplify an electrode connection process and significantly reduce processing time for connecting the LED device 150 and the pixel circuit PC, thereby improving the productivity of the LED display device.

However, other exemplary embodiments may provide a variety of configurations in which the pixel electrode PE and the common electrode CE are disposed on the planarization layer 115-1 and 115-2, which will be described later.

According to an exemplary embodiment, the LED display device further includes a transparent buffer layer 116.

The transparent buffer layer 116 is provided above the substrate 110 to cover the entirety of the planarization layer 115-1 and 115-2, in which the pixel electrode PE and the common electrode CE are provided, to form a flat surface on top of the planarization layer 115-1 and 115-2 while protecting the LED device 150 and the pixel circuit PC from external impacts. Then, each of the pixel electrode PE and the common electrode CE is provided between the planarization layer 115-1 and 115-2 and the transparent buffer layer 116. The transparent buffer layer 116 according to an exemplary embodiment may be made of, but is not limited to, an optical clear adhesive (OCA) or an optical clear resin (OCR).

The LED display device according to an exemplary embodiment further includes a reflective layer 111 disposed below the light-emitting area of a subpixel, among the plurality of subpixels SP, corresponding thereto.

The reflective layer 111 is provided on the substrate 110 to overlap the light-emitting area including the LED device 150. Although the reflective layer 111 according to an exemplary embodiment may be made of the same material as the gate electrode GE of the driving thin-film transistor T2 and be provided on the same layer as the gate electrode GE, this is not intended to be limiting. The reflective layer 111 may be made of the same material as one of the electrodes of the driving thin-film transistor T2.

The reflective layer 111 reflects light incident from the LED device 150 toward a first portion (FP) of the LED device 150. Since the LED display device according to an exemplary embodiment includes the reflective layer 111, the LED display device has a top emission structure. Alternatively, when the LED display device according to an exemplary embodiment has a bottom emission structure, the reflective layer 111 may be removed or may be disposed on top of the LED device 150.

Optionally, the reflective layer 111 may be made of the same material as at least one of the source and drain electrodes SE and DE of the driving thin-film transistor T2 to be provided on the same layer as the source/drain electrode SE/DE.

In the LED display device according to an exemplary embodiment, the LED device 150 may be disposed on a portion corresponding to the top portion of the reflective layer 111 corresponding thereto, via the bonding material 114.

The bonding material 114 is sandwiched between the recess 1330 of each subpixel SP and the LED device 150 to bond the LED device 150 to the bottom surface of the recess 130 corresponding thereto, thereby initially fixing the LED device 150.

The bonding material 114 according to an exemplary embodiment adjoins a second portion (RP) of the LED device 150, i.e. the rear surface of a first semiconductor layer. The bonding material 114 can prevent the position of the LED device 150 from being misaligned during the mounting of the LED device while enabling the LED device 150 to be properly detached from an intermediate substrate used for transplantation, thereby minimizing defects in the transplantation of the LED device 150.

The bonding material 114 according to an exemplary embodiment can be dotted to each subpixel SP and spread by pressure applied thereto during a process of mounting a light-emitting device or an LED device, thereby being fixed to the second portion (RP) of the LED device 150. Consequently, the LED device 150 can be initially fixed in position by the bonding material 114. According to an exemplary embodiment, the process of mounting a light-emitting device can be performed to simply bonding the LED device 150 to a corresponding surface, thereby significantly reducing the mounting time of the LED device.

In addition, the bonding material 114 is sandwiched between the protective layer 113 and the planarization layer 115-1 and 115-2 and between the LED device 150 and the protective layer 113. The bonding material 114 according to another embodiment, as described above, is provided on the entire front surface of the protective layer 113 to coat the protective layer 113 at a predetermined thickness. Portions of the bonding material 114, i.e. coating portions of the front surface of the protective layer 113 in which contact holes are supposed to be provided, are removed when the contact holes are provided. According to an exemplary embodiment, before the process of mounting a light-emitting device, the entire front surface of the protective layer 113 can be coated with the bonding material 114 at a predetermined thickness, thereby reducing the process time for disposing the bonding material 114.

According to an exemplary embodiment, since the bonding material 114 is provided on the entire front surface of the protective layer 113, the planarization layer 115-1 and 115-2 according to an exemplary embodiment is provided to cover the bonding material 114.

According to further another exemplary embodiment, a separate recess for accommodating the LED device 150 is provided. The LED device 150 may be located within the recess via the bonding material 114. Alternatively, the recess for accommodating the LED device 150 may be removed depending on a variety of process conditions for providing a display device.

The process of mounting a light-emitting device according to an exemplary embodiment may include a process of mounting red light-emitting devices in the red subpixels SP1, respectively, a process of mounting green light-emitting devices in the green subpixels SP2, respectively, and a process of mounting blue light-emitting devices in the blue subpixels SP3, respectively. A process of mounting white light-emitting devices in the white subpixels may be additionally provided.

The process of mounting a light-emitting device according to an exemplary embodiment may include a process of only mounting white light-emitting devices in the subpixels, respectively. In this case, the substrate 110 includes a color filter layer overlapping the subpixels. The color filter layer allows a specific wavelength of light, among wavelengths of white light, having a color corresponding to a specific subpixel, to pass therethrough.

The process of mounting a light-emitting device according to an exemplary embodiment may include a process of only mounting light-emitting devices having a first color in subpixels, respectively. In this case, the substrate 110 includes a wavelength conversion layer and a color filter layer overlapping the subpixels. The wavelength conversion layer emits a second color of light, based on a portion of a first color of light incident from the light-emitting device. The color filter layer allows a specific wavelength of light, among wavelengths of white light, having a color corresponding to a specific subpixel, to pass therethrough. The first color may be blue, while the second color may be yellow. The color conversion layer may contain a fluorescent material or quantum dot particles emitting a second color of light, based on a portion of the first color of light.

Describing with reference to FIG. 3A to FIG. 3B, in the above-described configuration according to an exemplary embodiment, the LED device 150 includes the first electrodes E1 and the second electrodes E2 on the top and bottom surfaces thereof. Thus, even in the case in which the LED device 150 is inverted while being disposed, one of the first electrodes E1 and one of the second electrodes E2 can be connected to corresponding semiconductor layers, respectively. Hereinafter, a detailed configuration of the LED device 150 will be described with reference to the following drawings.

Figure 4A:
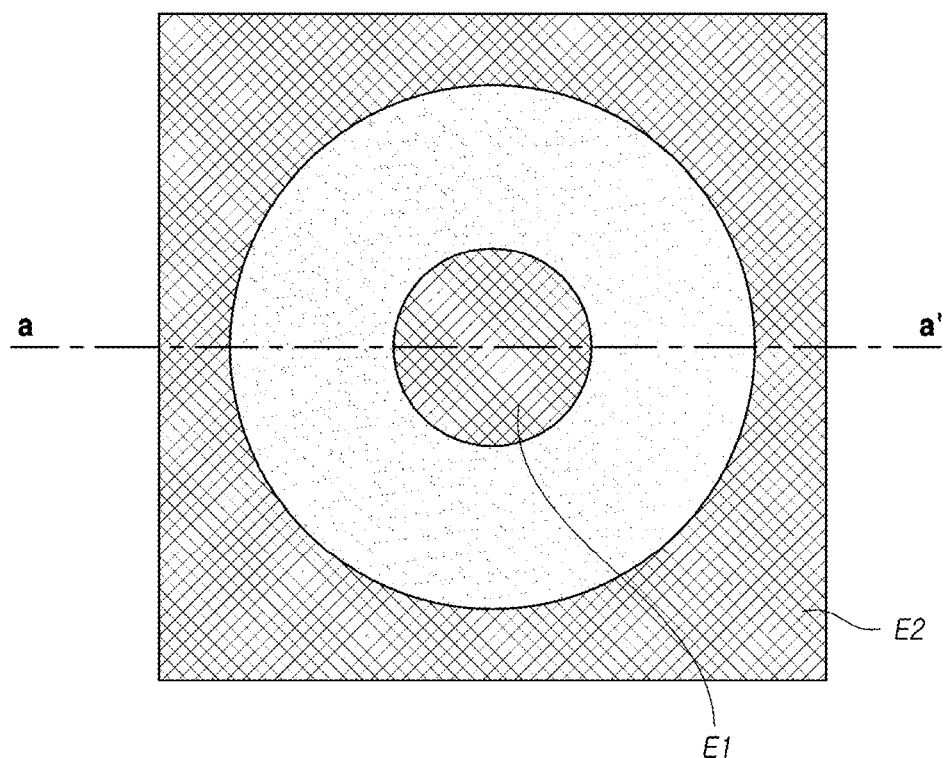
FIG. 4A is a schematic top view illustrating a light-emitting device according to an exemplary embodiment.
Figure 4B:
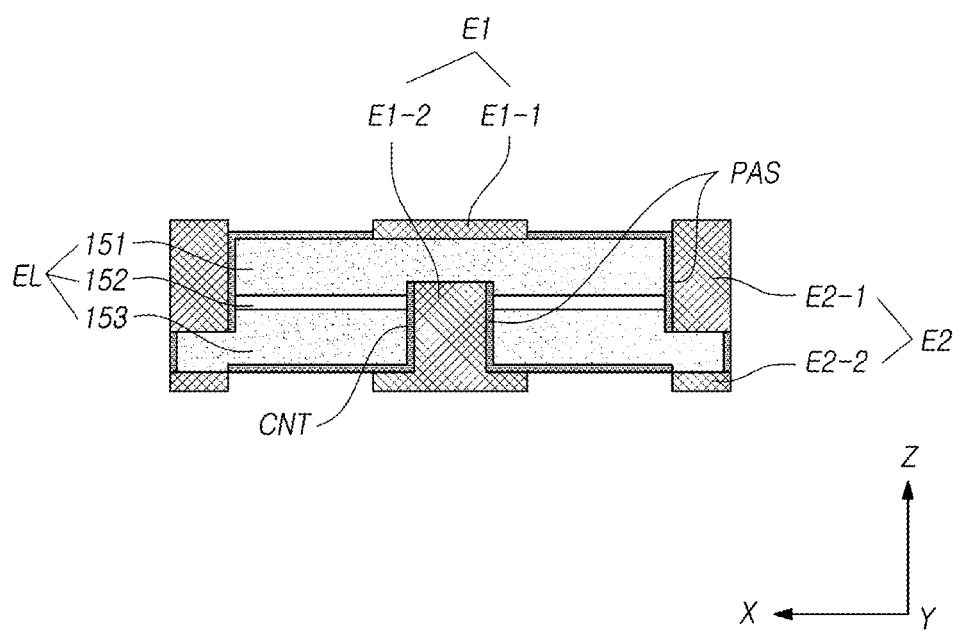
FIG. 4B is a schematic cross-sectional view of the light-emitting device illustrated in FIG. 4A, taken along line a-a' in FIG. 4A.

FIG. 4A is a schematic top view illustrating a light-emitting device according to an exemplary embodiment, and FIG. 4B is a schematic cross-sectional view of the light-emitting device illustrated in FIG. 4A, taken along line a-a' in FIG. 4A.

The following description will be provided with reference to FIGS. 4A and 4B, in conjunction with the foregoing drawings.

The LED device 150 according to an exemplary embodiment includes a light-emitting layer EL, first electrodes E1, and second electrodes E2. The light-emitting layer EL includes a first semiconductor layer 151, an active layer 152, and a second semiconductor layer 153. The LED device 150 emits light due to electron-hole recombination along with current flowing between the first electrodes E1 and the second electrodes E2.

Although the first semiconductor layer 151 and the second semiconductor layer 153 may be referred to as a p-type semiconductor layer and an n-type semiconductor layer, the semiconductor layers 151 and 153 will be described as being the first semiconductor layer 151 and the second semiconductor layer 153 for convenience of description. In addition, although the first electrodes E1 and the second electrodes E2 may be referred to as p-type electrodes and n-type electrodes or vice versa, depending on electrical connections, i.e. depending on the semiconductor layers to which the electrodes are electrically connected, the electrodes E1 and E2 will be described as being the first electrodes and the second electrodes in the same manner, for convenience of description. Although the first semiconductor layer 151 and the second semiconductor layer 153 will be described herein as being a p-type semiconductor layer and an n-type semiconductor layer, the first semiconductor layer 151 and the second semiconductor layer 153 may be opposite-polarity semiconductor layers, i.e. an n-type semiconductor layer and a p-type semiconductor layer, respectively.

The first semiconductor layer 151 is provided on the active layer 152 to provide holes to the active layer 152. The first semiconductor layer 151 according to an exemplary embodiment may be made of a p-GaN based semiconductor material selected from among, but not limited to, GaN, AlGaN, InGaN, and AlInGaN. Impurities used for doping of the first semiconductor layer 151 may include, but are not limited to, Mg, Zn, and Be.

The second semiconductor layer 153 provides electrons to the active layer 152. The second semiconductor layer 153 according to an exemplary embodiment may be made of an n-GaN based semiconductor material selected from among, but not limited to, GaN, AlGaN, InGaN, and AlInGaN. Impurities used for doping of the second semiconductor layer 153 may include, but are not limited to, Si, Ge, Se, Te, and C.

The active layer 152 is provided on the second semiconductor layer 153. The active layer 152 may have a multiple quantum well (MQW) structure comprised of well layers and barrier layers having a higher band gap than the well layers. The active layer 152 according to an exemplary embodiment may have an MQW structure made of InGaN/GaN or the like.

The first electrodes E1 (E1-1, E1-2) are electrically connected to the first semiconductor layer 151. The first electrodes E1-1 and E1-2 may be disposed on the first semiconductor layer 151 and the second semiconductor layer 153. The first electrode E1-2, disposed on the second semiconductor layer 153, is connected to the first semiconductor layer 151 through a contact hole CNT disposed in the second semiconductor layer 153, and is insulated from the second semiconductor layer 153 by an insulation film PAS.

That is, the first electrode E1-1 disposed on the first semiconductor layer 151 and the first electrode E1-2 disposed on the second semiconductor layer 153 are separated each other, and each of the first electrodes E1-1, E1-2 is disposed on a top surface of the first semiconductor layer 151 and a bottom surface of the first semiconductor layer 151 in an area where the first semiconductor layer 151 is etched. And the first electrode E1-1 is directly electrically connected to the first semiconductor layer 151, the first electrode E1-2 is electrically connected to the first semiconductor layer 151 through the contact hole CNT. And a width of a portion of the first electrode E1-2 located inside the contact hole CNT may be narrower than a width of a portion of the first electrode E1-2 located outside the contact hole CNT.

The first electrodes E1-1 and E1-2 are connected to the drain electrode DE or the source electrode SE of the driving transistor T2, i.e. a driving thin-film pixel.

The second electrodes E2 (E2-1, E2-2) are disposed on the first semiconductor layer 151 and the second semiconductor layer 153. The second electrodes E2-1 and E2-2 are insulated from the active layer 152 and the first semiconductor layer 151 by the insulation film PAS and is connected to the common power line CPL.

The second electrode E2-2, disposed on the side of the second semiconductor layer 153, is electrically connected to the second semiconductor layer 153 while being disposed on the second semiconductor layer 153. In contrast, the second electrode E2-1, disposed on the side of the first semiconductor layer 151, may be insulated from the first semiconductor layer 151 by the insulation film PAS, may extend to the second semiconductor layer 153 to be electrically connected to the second semiconductor layer 153, and may extend to a side surface of the first semiconductor layer 151 to be connected to the second semiconductor layer 153.

That is, the second electrode E2-1 disposed on the side of the first semiconductor layer 151 and the second electrode E2-2 disposed on the side of the second semiconductor layer 153 are separated each other, and each of the second electrodes E2-1, E2-2 is disposed on a top surface of the second semiconductor layer 153 and a bottom surface of the second semiconductor layer 153 in an area where the second semiconductor layer 153 is etched.

The first electrodes E1-1 and E1-2 may be p-type electrodes, while the second electrodes E2-1 and E2-2 may be n-type electrodes. Although the electrodes may be categorized depending on whether each electrode supplies electrons or holes, i.e. depending on whether each electrode is electrically connected to the p-type semiconductor layer or the n-type semiconductor layer, the electrodes will be referred to herein as the first electrodes E1-1 and E1-2 and the second electrodes E2-1 and E2-2.

As illustrated in FIG. 4B, the LED device 150 may be a microscopic device having a width of 10 μm to 100 μm along the X axis and a height of 6 μm or less along the Y axis. When the LED device 150, i.e. a microscopic device having the above-described width and height, is disposed on the substrate 110, the LED device 150 may be inverted along the Z axis or may be rotated along the X axis, in consideration of the width and axes thereof.

The first electrodes E1-1 and E1-2 may be disposed in the central portions of the LED device 150, and the second electrodes E2-1 and E2-2 may be disposed on peripheral portions of the LED device 150 to surround the first electrodes E1-1 and E1-2.

As described above regarding the electrode structure of the LED device 150, even in the case in which the LED device 150 is rotated along the X axis while being disposed, an influence on the electrical connection between the electrodes can be reduced, thereby minimizing defects that would otherwise occur while the LED device 150 is being disposed.

Each of the first and second electrodes E1 and E2 according to an exemplary embodiment may be made of a material containing at least one selected from among, but not limited to, metal materials, such as Au, W, Pt, Si, Ir, Ag, Cu, Ni, Ti, and Cr, and alloys thereof. Each of first and second electrodes E1 and E2 according to another exemplary embodiment may be made of a transparent conductive material. The transparent conductive material may be, but is not limited to, ITO or IZO.

The insulation film PAS according to an exemplary embodiment may be made of $SiO_2$ or the like. The insulation film PAS may be disposed to cover the LED device 150, thereby preventing the first semiconductor layer 151, the active layer 152, and the second semiconductor layer 153 from being exposed externally. The insulation film PAS may be disposed to insulate the first semiconductor layer 151 from the second electrodes E2 and the second semiconductor layer 153 from the first electrodes E1, as described above.

Alternatively, the insulation film PAS may be disposed to surround the first and second electrodes E1 and E2, such that the first and second electrodes E1 and E2 are not exposed externally. This can consequently prevent the first and second electrodes E1 and E2 from being oxidized. The insulation film PAS may have open areas in portions in which the first and second electrodes E1 and E2, the pixel electrode PE, and the common electrodes CE are electrically connected.

As an additional embodiment, the second semiconductor layer 153, the active layer 152, and the first semiconductor layer 151 may be sequentially layered on a semiconductor substrate, thereby providing the LED device 150. The semiconductor substrate may be a semiconductor material, such as a sapphire substrate or a silicon substrate. After the semiconductor substrate is used as a growth substrate for growing the second semiconductor layer 153, the active layer 152, and the first semiconductor layer 151 thereon, the semiconductor substrate may be separated from the second semiconductor layer 153 in a substrate separation process. The substrate separation process may be laser lift-off, chemical lift-off, or the like. Since the growth substrate is removed from the LED device 150, as described above, the LED device 150 can have a reduced thickness so as to be accommodated in each subpixel SP.

Figure 5:
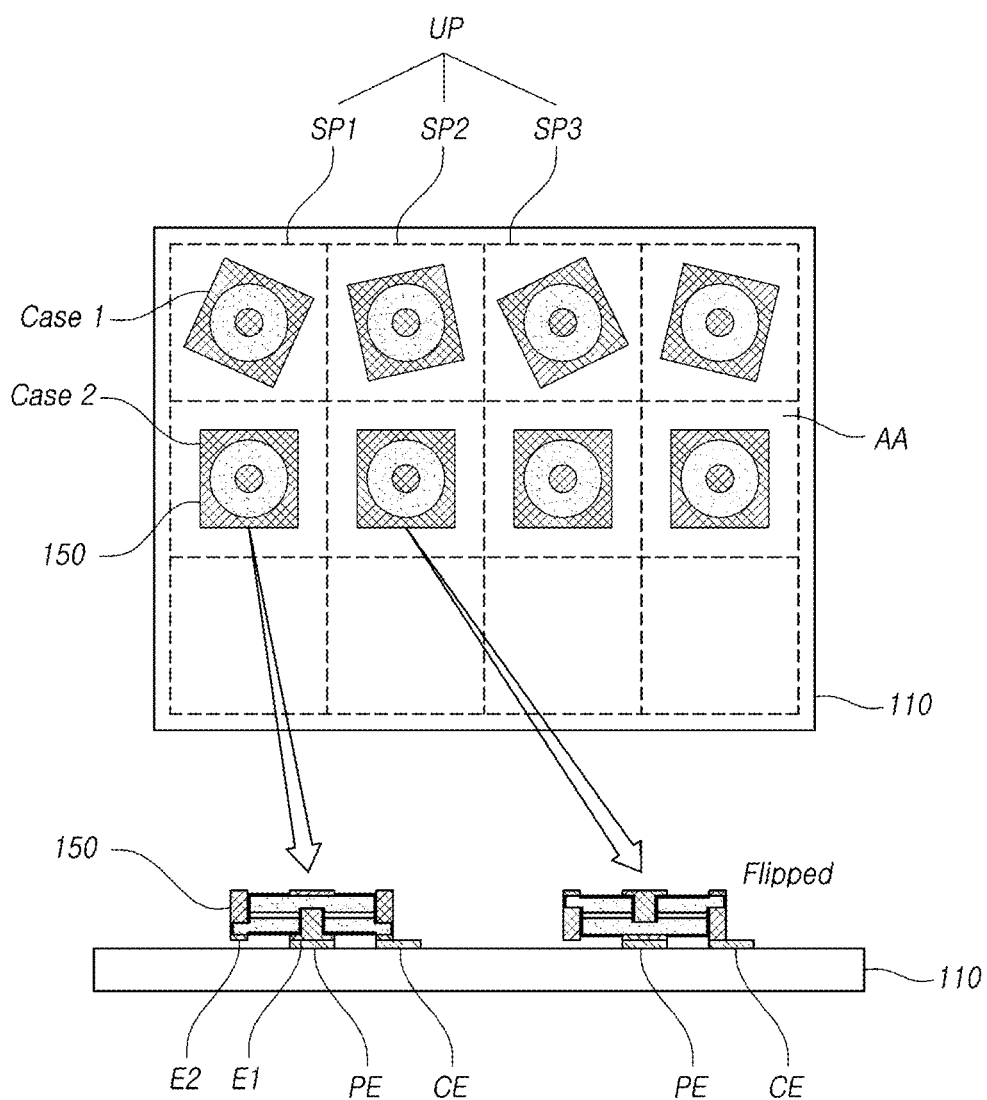
FIG. 5 is a schematic view illustrating an arrangement of light-emitting devices according to an exemplary embodiment.

FIG. 5 is a schematic view illustrating an arrangement of light-emitting devices according to an exemplary embodiment. In FIG. 5, some of the components, such as the thin-film transistor, illustrated in the foregoing drawings, are removed. Although pixel electrodes PE and common electrodes CE are illustrated as being connected to the bottom portions of the LED devices 150, details thereof are omitted for convenience of description. The connections of the electrodes will be described with reference to FIG. 6, in which the electrodes are connected to the bottom portions of an LED device 150.

Alternatively, a structure in which the electrodes are connected to the top portions of the LED device 150 may be provided.

Referring to FIG. 5, each of the LED devices 150 is disposed on a substrate 110, more particularly, in a corresponding subpixel of subpixels SP1, SP2, and SP3 of a unit pixel UP, and is electrically connected to the pixel electrode PE and the common electrode CE. The pixel electrode PE is aligned and in contact with one of first electrodes E1 disposed on the central portions of the LED device 150 to be electrically connected to one of the first electrodes E1. As in Case 1, one of the second electrodes E2 may be in contact with and electrically connected to the common electrode CE even in the case in which the LED device 150 is misaligned while being disposed.

In addition, as in Case 2 illustrated in FIG. 5, even in the case in which the LED device 150 is disposed on the substrate 110 in an inverted position, the pixel electrode PE and the common electrode CE can be in contact with and electrically connected to the other one of the first electrodes E1 and the other one of the second electrodes E2. Accordingly, it is possible to reduce defects that would occur while the LED devices 150 are being disposed on the substrate 110.

Figure 6:
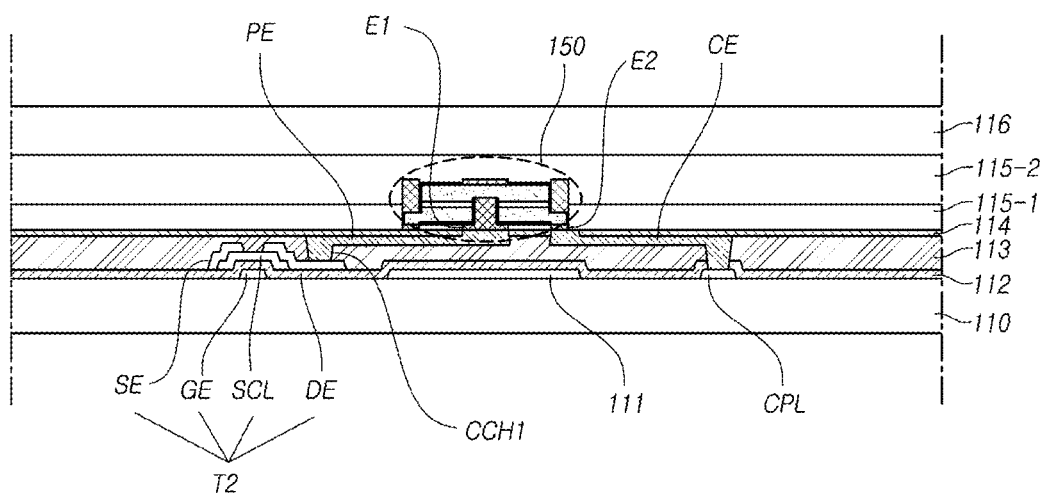
FIG. 6 is a schematic cross-sectional view illustrating a variety of applications of an LED device according to an exemplary embodiment.

FIG. 6 is a schematic cross-sectional view illustrating a variety of applications of an LED device according to an exemplary embodiment.

An LED device 150 of a display device including a plurality of LED devices 150, as well as a connection structure of electrodes, will be described with reference to FIG. 6, in conjunction with the foregoing drawings. In the following description, descriptions of the repeated or same components will be omitted.

According to an exemplary embodiment, the LED device 150 is electrically connected to a thin-film transistor T2 and a common power line CPL disposed on a substrate 110. Although the LED device 150 may be configured to be electrically connected to the thin-film transistor T2 and the common power line CPL via one of first electrodes E1 and one of second electrodes E2 disposed on the top portions of the LED device 150, the LED device 150 may be connected to the thin-film transistor T2 and the common power line CPL via the other one of the first electrodes E1 and the other one of the second electrodes E2 disposed on the bottom portions of the LED device 150, as illustrated in FIG. 6.

According to another modified embodiment, regarding the electrical connection of the first electrodes E1 and the second electrodes E2 of the LED device 150 to the thin-film transistor T2 and the common power line CPL, one of the first electrode E1 and one of the second electrode E2 disposed on the top portions of the LED device 150 or the other one of the first electrodes E1 and the other one of the second electrodes E2 disposed on the bottom portions of the LED device 150 may be selectively used to electrically connect the thin-film transistor T2 and the common power line CPL to the LED device 150.

Specifically, the pixel electrode PE may be provided by forming a contact hole or the like in a top portion of a planarization layer 115-1 and 115-2 disposed on top of the thin-film transistor T2 to connect one of the first electrodes E1, disposed on top of the LED device 150, to the thin-film transistor T2. The common electrode CE may be connected to the common power line CPL to be electrically connected to the other one of the second electrodes E2, located on the bottom of the LED device 150. When electrical connections are completed using different electrodes on the top portion and the bottom portion of the LED device 150, the reliability of the process of connecting the electrodes can be advantageously improved.

In addition, the above-described method of connecting the electrodes may be carried out in a reverse manner. The first electrode E1 and the second electrode E2 of the LED device 150 may be connected to the pixel electrode PE and the common electrode CE located below the LED device 150 using a method of melting the butted surfaces of the electrodes using high-temperature heat generated by electrical resistance against current supplied to the adjoined electrodes so that the contact portions of the two electrodes are welded or a method of melting and welding the surfaces of the electrodes connected to the LED device 150, on the bottom surface of the substrate 110, using a laser beam.

That is, only one of the first electrodes E1 disposed on top and below the LED device 150 is electrically connected to the pixel electrode PE or the common electrode CE. And only one of the second electrodes E2 disposed top and below the LED device 150 is electrically connected to the common electrode CE or the pixel electrode PE. Here, a position of the first electrode E1 or the second electrode E2 which is connected to the pixel electrode PE or the common electrode CE may be selected variously.

Figure 7:
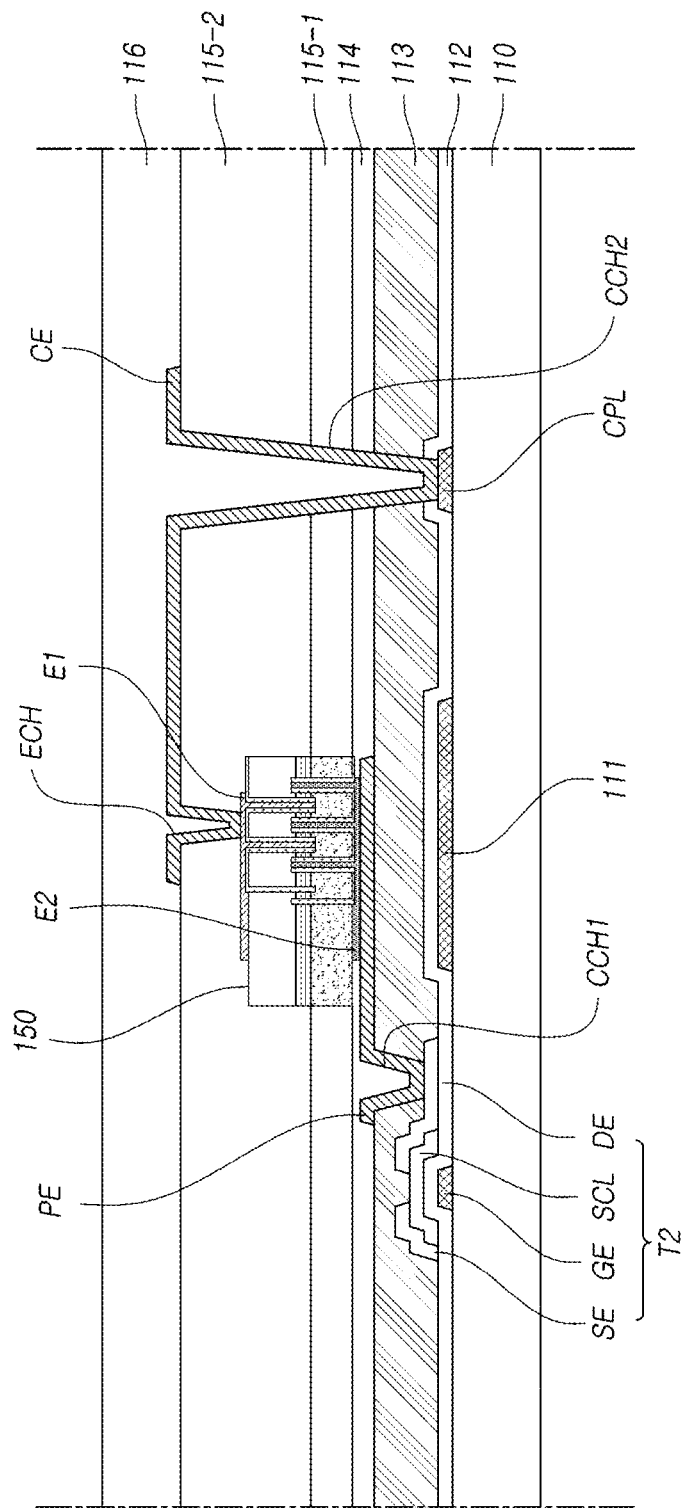
FIG. 7 is a schematic cross-sectional view illustrating a display device including an LED device according to an exemplary embodiment.

FIG. 7 is a schematic cross-sectional view illustrating a display device including an LED device according to an exemplary embodiment.

The following description will be provided with reference to FIG. 7, in conjunction with the foregoing drawings. Each of subpixels SP1, SP2, and SP3 of the display device according to an exemplary embodiment includes a protective layer 113, an LED device 150, a planarization layer 115-1 and 115-2, a pixel electrode PE, and a common electrode CE. Since some components are the same as those described above with reference to FIGS. 3A and 3B, descriptions thereof will be omitted.

The pixel electrode PE is configured to connect one of the second electrodes E2 of the LED device 150 to a drain electrode DE of the driving thin-film transistor T2. The pixel electrode PE may be configured to connect one of the second electrodes E2 of the LED device 150 to a source electrode, depending on the configuration of the thin-film transistor T2. The pixel electrode PE, as described above, may be defined as an anode. The pixel electrode PE according to an exemplary embodiment is provided on a portion of the front surface of the planarization layer 115-1 and 115-2 to overlap the second electrodes E2 of the LED device 150 and the driving thin-film transistor T2. The pixel electrode PE is electrically connected to the drain electrode DE or the source electrode SE of the driving thin-film transistor T2 through a first circuit contact hole CCH1 extending through a protective layer 113, and is electrically connected to one of the second electrodes E2 of the LED device 150, located above the protective layer 113. Accordingly, one of the second electrodes E2 of the LED device 150 is electrically connected to the drain electrode DE or the source electrode SE of the driving thin-film transistor T2 via the pixel electrode PE.

Regarding the connection to the source electrode SE and the drain electrode DE, the drain electrode DE and the pixel electrode PE are illustrated as being connected to each other, but the pixel electrode PE and the source electrode SE may be connected to each other. A configuration regarding the connection may be selected by a person having ordinary skill in the art.

The pixel electrode PE may be made of a transparent conductive material when the LED display device has a top emission structure or may be made of a light-reflecting conductive material when the LED display device has a bottom emission structure. The transparent conductive material may be, but is not limited to, ITO or IZO. The light-reflecting conductive material may be one selected from among, but is not limited to, Al, Ag, Au, Pt, and Cu. The pixel electrode PE made of a light-reflecting conductive material may be provided as a single layer containing the light-reflecting conductive material or a multilayer structure containing multiple single layers.

The common electrode CE electrically connects one of the second electrodes E2 of the LED device 150 to the common power line CPL. The common electrode CE may be defined as a cathode. The common electrode CE is provided on a portion of the front surface of the planarization layer 115-1 and 115-2 to overlap the first electrodes E1 of the LED device 150 and the common power line CPL. Here, the common electrode CE may be made of the same material as the pixel electrode PE.

One portion of the common electrode CE according to an exemplary embodiment is electrically connected to the common power line CPL through a second circuit contact hole CCH2 while overlapping the common power line CPL. The second circuit contact hole CCH2 extends through the insulating layer 112, the protective layer 113, and the planarization layer 115-1 and 115-2. The other portion of the common electrode CE according to an exemplary embodiment is electrically connected to one of the first electrodes E1 of the LED device 150 through an electrode contact hole ECH overlapping the second electrodes E1 of the LED device 150. The electrode contact hole ECH is provided in the planarization layer 115-1 and 115-2. Accordingly, one of the first electrodes E1 of the LED device 150 is electrically connected to the common power line CPL via the common electrode CE.

The pixel electrode PE according to an exemplary embodiment may be simultaneously provided in a deposition process of depositing an electrode material on the protective layer 113 having the first circuit contact hole CCH1, a photolithography process, and an electrode patterning process using etching. In addition, a pad electrode or the like may be added to efficiently electrically connect the pixel electrode PE to one of the second electrodes E2 of the LED device 150. The common electrode CE may be simultaneously provided in a deposition process of depositing an electrode material on the planarization layer 115-1 and 115-2 having the second circuit contact hole CCH2.

According an exemplary embodiment, the LED display device further includes a transparent buffer layer 116. The transparent buffer layer 116 is provided above the substrate 110 to cover the entirety of the planarization layer 115-1 and 115-2, in which the common electrode CE is provided, to form a flat surface on top of the planarization layer 115-1 and 115-2 while protecting the LED device 150 and the pixel circuit PC from external impacts. Then, each of the pixel electrode PE and the common electrode CE is provided between the planarization layer 115-1 and 115-2 and the transparent buffer layer 116. The transparent buffer layer 116 according to an exemplary embodiment may be made of, but is not limited to, an optical clear adhesive (OCA) or an optical clear resin (OCR).

The LED display device according to an exemplary embodiment further includes a reflective layer 111 disposed below the light-emitting area of a subpixel, among the plurality of subpixels SP, corresponding thereto. The reflective layer 111 is provided on the substrate 110 to overlap the light-emitting area including the LED device 150. Although the reflective layer 111 according to an exemplary embodiment may be made of the same material as the gate electrode GE of the driving thin-film transistor T2 and be provided on the same layer as the gate electrode GE, this is not intended to be limiting. The reflective layer 111 may be made of the same material as one of the electrodes of the driving thin-film transistor T2.

The reflective layer 111 reflects light incident from the LED device 150 toward the top portion of the LED device 150. Since the LED display device according to an exemplary embodiment includes the reflective layer 111, the LED display device has a top emission structure. Alternatively, when the LED display device according to an exemplary embodiment has a bottom emission structure, the reflective layer 111 may be removed or may be disposed on top of the LED device 150.

Optionally, the reflective layer 111 may be made of the same material as at least one of the source and drain electrodes SE and DE of the driving thin-film transistor T2 to be provided on the same layer as the source/drain electrode SE/DE.

In the LED display device according to an exemplary embodiment, the LED device 150 may be disposed on a portion corresponding to the top portion of the reflective layer 111 corresponding thereto, via the bonding material 114. The bonding material 114 may be disposed within the recess of each subpixel SP. The recess may be provided by forming a portion of the planarization layer 115-1 and 115-2 or the protective layer 113 to be concave or machining or processing a portion of the plurality of layers, such as the planarization layer 115-1 and 115-2. The bonding material 114 may initially fix the LED device 150 within the recess. However, the configuration of the recess may not be essential.

The bonding material 114 according to an exemplary embodiment adjoins the bottom portion of the LED device 150. The bonding material 114 can prevent the position of the LED device 150 from being misaligned during the mounting of the LED device while enabling the LED device 150 to be properly detached from an intermediate substrate used for transplantation, thereby minimizing defects in the transplantation of the LED device 150.

The bonding material 114 according to an exemplary embodiment can be dotted to each subpixel SP and spread by pressure applied thereto during a process of mounting a light-emitting device, thereby being fixed to the second portion (RP) of the LED device 150.

Consequently, the LED device 150 can be initially fixed in position by the bonding material 114. According to an exemplary embodiment, the process of mounting a light-emitting device can be performed to simply bonding the LED device 150 to a corresponding surface, thereby significantly reducing the mounting time of the LED device.

In addition, the bonding material 114 is sandwiched between the protective layer 113 and the planarization layer 115-1 and 115-2 and between the LED device 150 and the protective layer 113. The bonding material 114 according to another embodiment, as described above, is provided on the entire front surface of the protective layer 113 to coat the protective layer 113 at a predetermined thickness. Portions of the bonding material 114, i.e. coating portions of the front surface of the protective layer 113 in which contact holes are supposed to be provided, are removed when the contact holes are provided. According to an exemplary embodiment, before the process of mounting a light-emitting device, the entire front surface of the protective layer 113 can be coated with the bonding material 114 at a predetermined thickness, thereby reducing the process time for disposing the bonding material 114.

According to an exemplary embodiment, since the bonding material 114 is provided on the entire front surface of the protective layer 113, the planarization layer 115-1 and 115-2 according to an exemplary embodiment is provided to cover the bonding material 114.

According to further another exemplary embodiment, a separate recess for accommodating the LED device 150 is provided. The LED device 150 may be located within the recess via the bonding material 114. Alternatively, the recess for accommodating the LED device 150 may be removed depending on a variety of process conditions for providing a display device.

Alternatively, in the above-described configuration, the bonding material 114 may be a film or a resin-based bonding layer disposed on top of the protective layer 113. The film or resin-based bonding layer includes conductive balls that are only disposed below the LED device 150. The bonding material 114 may be a bonding layer containing conductive balls or a conductive material for electrical connection between one of the second electrodes E2, located on the bottom portion of the LED device 150, and the pixel electrode PE.

The process of mounting a light-emitting device according to an exemplary embodiment may include a process of mounting red light-emitting devices in the red subpixels SP1, respectively, a process of mounting green light-emitting devices in the green subpixels SP2, respectively, and a process of mounting blue light-emitting devices in the blue subpixels SP3, respectively. A process of mounting white light-emitting devices in the white subpixels may be additionally provided.

The process of mounting a light-emitting device according to an exemplary embodiment may include a process of only mounting white light-emitting devices in the subpixels, respectively. In this case, the substrate 110 includes a color filter layer overlapping the subpixels. The color filter layer allows a specific wavelength of light, among wavelengths of white light, having a color corresponding to a specific subpixel, to pass therethrough.

The process of mounting a light-emitting device or an LED device according to an exemplary embodiment may include a process of only mounting light-emitting devices having a first color in subpixels, respectively. In this case, the substrate 110 includes a wavelength conversion layer and a color filter layer overlapping the subpixels. The wavelength conversion layer emits a second color of light, based on a portion of a first color of light incident from the light-emitting device. The color filter layer allows a specific wavelength of light, among wavelengths of white light, having a color corresponding to a specific subpixel, to pass therethrough. The first color may be blue, while the second color may be yellow. The color conversion layer may contain a fluorescent material or quantum dot particles emitting a second color of light, based on a portion of the first color of light.

In the above-described configuration according to an exemplary embodiment, the LED device 150 includes the first electrodes E1 and the second electrodes E2 on the top surface and the bottom surface thereof. Even in the case in which the LED device 150 inverted while being disposed, the LED device can generate light due to electrons and holes supplied from one of the first electrodes E1 and one of the second electrodes E2. Detailed configurations of the LED device 150 will be described with reference to the following drawings.

Figure 8A:
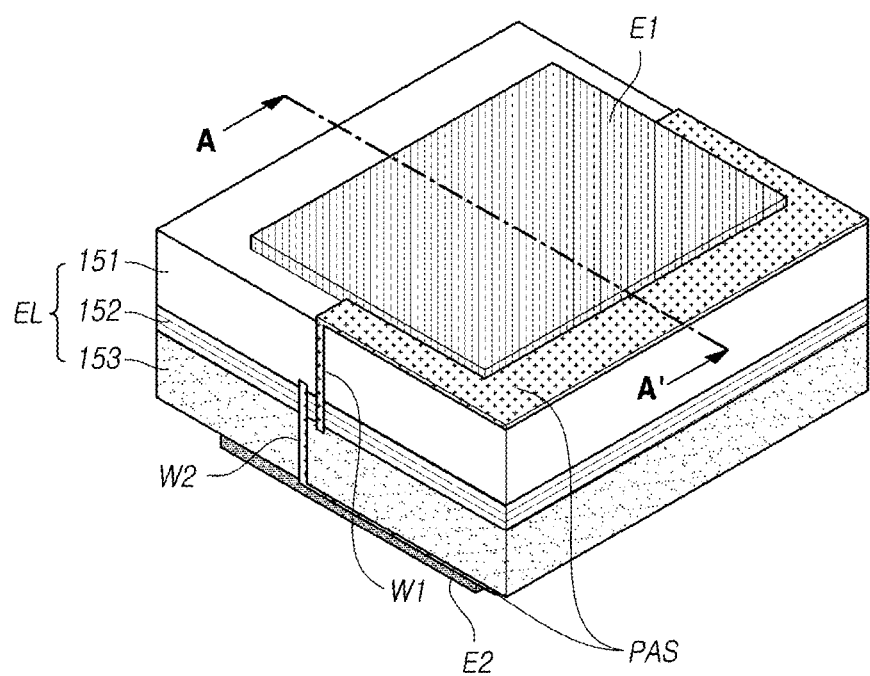
FIG. 8A is a schematic perspective view illustrating a light-emitting device according to an exemplary embodiment.
Figure 8B:
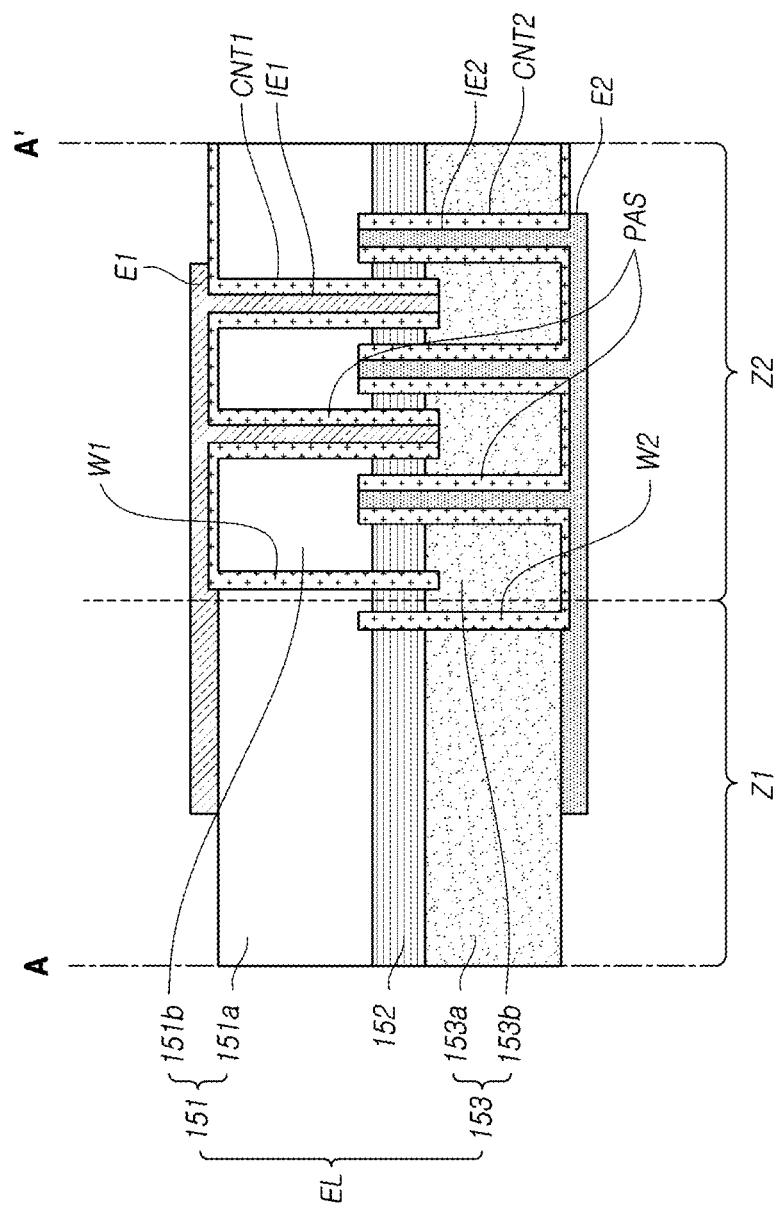
FIG. 8B is a schematic cross-sectional view of the light-emitting device illustrated in FIG. 8A, taken along line A-A' in FIG. 8A.

FIG. 8A is a schematic perspective view illustrating a light-emitting device according to an exemplary embodiment, and FIG. 8B is a schematic cross-sectional view of the light-emitting device illustrated in FIG. 8A, taken along line A-A' in FIG. 8A.

The following description will be provided with reference to FIGS. 8A and 8B, in conjunction with the foregoing drawings.

The LED device 150 according to an exemplary embodiment includes a light-emitting layer EL, a first electrode El, and a second electrode E2. The light-emitting layer EL includes a p-type semiconductor layer 151, an active layer 152, and an n-type semiconductor layer 153. The LED device 150 emits light due to electron-hole recombination along with current flowing between the first electrode E1 and the second electrode E2.

The p-type semiconductor layer 151 is semiconductor in which holes are used as charge carriers. Current is generated when positively-charged holes move as carriers. That is, the p-type semiconductor layer 151 is semiconductor in which holes are major carriers. The n-type semiconductor layer 153 is semiconductor in which free electrons are used as charge carriers. Current is generated when negatively-charged electrons move as carriers. That is, the n-type semiconductor layer 153 is semiconductor in which electrons are major carriers.

Although the first electrode E1 and the second electrode E2 may be referred to as a p-type electrode and an n-type electrode or vice versa, depending on electrical connections, i.e. the semiconductor layers to which the electrodes are electrically connected, the electrodes E1 and E2 will be described as being the first electrode E1 and the second electrode E2. In addition, although the arrangement relationship of the p-type semiconductor layer 151 and the n-type semiconductor layer 153 will be described by way of example, the positions of the p-type semiconductor layer 151 and the n-type semiconductor layer 153 may be exchanged.

The p-type semiconductor layer 151 is provided on the active layer 152 to provide holes to the active layer 152. The p-type semiconductor layer 151 according to an exemplary embodiment may be made of a p-GaN based semiconductor material selected from among, but not limited to, GaN, AlGaN, InGaN, and AlInGaN. Impurities used for doping of the p-type semiconductor layer 151 may include, but are not limited to, Mg, Zn, and Be.

The n-type semiconductor layer 153 provides electrons to the active layer 152. The n-type semiconductor layer 153 according to an exemplary embodiment may be made of an n-GaN based semiconductor material selected from among, but not limited to, GaN, AlGaN, InGaN, and AlInGaN. Impurities used for doping of the n-type semiconductor layer 153 may include, but are not limited to, Si, Ge, Se, Te, and C.

The active layer 152 is provided on the n-type semiconductor layer 153. The active layer 152 may have a multiple quantum well (MQW) structure comprised of well layers and barrier layers having a higher band gap than the well layers. The active layer 152 according to an exemplary embodiment may have an MQW structure made of InGaN/GaN or the like.

The p-type semiconductor layer 151 may include a first p-type semiconductor layer 151a and a second p-type semiconductor layer 151b, which are divided by a first wall W1. The first wall W1, by which the p-type semiconductor layer 151 is divided into the first p-type semiconductor layer 151a and the second p-type semiconductor layer 151b, may be made of an insulating material, such as SiOx or SiNx. The first p-type semiconductor layer 151a and the second p-type semiconductor layer 151b are insulated from each other by the first wall W1, thereby blocking direct movement of holes.

The n-type semiconductor layer 153 may include a first n-type semiconductor layer 153a and a second n-type semiconductor layer 153b, which are divided by a second wall W2. The second wall W2, by which the n-type semiconductor layer 153 is divided into the first n-type semiconductor layer 153a and the second n-type semiconductor layer 153b, may be made of an insulating material, such as SiOx or SiNx. The first n-type semiconductor layer 153a and the second n-type semiconductor layer 153b are insulated from each other by the second wall W2, thereby blocking direct movement of electrons.

The second p-type semiconductor layer 151b is insulated from the first electrodes E1, and has at least one first contact hole CNT1. The first contact hole CNT1 extends into the second n-type semiconductor layer 153b, with a first inner electrode IE1 being provided within the first contact hole CNT1, such that the first electrode E1 and the second n-type semiconductor layer 153b are electrically connected by the first inner electrode IE1.

The second n-type semiconductor layer 153b is insulated from the second electrodes E2, and has at least one second contact hole CNT2. The second contact hole CNT2 extends into the second p-type semiconductor layer 151b, with a second inner electrode IE2 being provided within the second contact hole CNT2, such that the second electrode E2 and the second p-type semiconductor layer 151b are electrically connected by the second inner electrode IE2.

As described above, the LED device 150 may be divided into a first zone Z1 and a second zone Z2 by the first wall W1 and the second wall W2. According to the above-described configuration, in the first zone Z1 including the first n-type semiconductor layer 153a and the first p-type semiconductor layer 151a on both sides of the active layer 152, light may be generated in a forward bias state in which holes are supplied from the first electrode E1 and electrons are supplied from the first electrode El. In a reverse bias state in which electrons are supplied from the first electrode E1 and holes are supplied from the second electrode E2, current may be blocked.

In addition, in the second zone Z2 including the second n-type semiconductor layer 153b and the second p-type semiconductor layer 151b on both sides of the active layer 152, current may be blocked in a forward bias state in which holes are supplied from the first electrode E1 and electrons are supplied from the first electrode El. In a reverse bias state in which electrons are supplied from the first electrode E1 and holes are supplied from the second electrode E2, light may be generated.

When the forward bias and the reverse bias are applied in a manner opposite to the above-described case, light may be generated or current may be blocked, depending on electrons and holes applied to the n-type semiconductor layer 153 and the p-type semiconductor layer 151.

Specifically, with reference to the above-described configuration, in the forward reverse bias, light is generated by electron-hole recombination in one of the first zone Z1 and the second zone Z2 while current is blocked in the other zone. Even in the case in which unintended current, such as static electricity, is generated in the display device, electrons and holes can be recombined without exceeding the limitations of the internal devices of the display device, thereby improving the reliability of longevity. In addition, abnormal current applied to the driving devices or the like of the display device can be reduced, thereby protecting the driving devices of the display device.

In addition, since the LED device 150 having the above-described configuration can generate light in both the forward bias and the reverse bias in which electrons and holes are supplied through the first electrode E1 and the second electrode E2, even in the case in which the LED device 150 is inverted while being disposed in a corresponding subpixel SP, the light-emitting function of the subpixel SP can be properly maintained.

The use of LED devices 150 having the above-described configuration can improve the reliability of the process of disposing the LED devices 150 and protecting the LED devices 150 and driving devices from unintended current, such as static electricity, thereby improving the reliability of longevity.

The first electrode E1 is disposed on the p-type semiconductor layer 151 to be electrically connected to the first p-type semiconductor layer 151a, and is insulated from the second p-type semiconductor layer 151b by an insulation film PAS. In addition, the second electrode E2 is disposed on the n-type semiconductor layer 153 to be electrically connected to the first n-type semiconductor layer 153a, and is insulated from the second n-type semiconductor layer 153b by an insulation film PAS.

The first electrode E1 is connected to the first inner electrode IE1 through at least one first contact hole CNT1 provided in the second p-type semiconductor layer 151b.

The first electrode E1 is electrically connected to the second n-type semiconductor layer 153b via the first inner electrode IE1.

The second electrode E2 is connected to a second inner electrode IE2 through at least one second contact hole CNT2 provided in the second n-type semiconductor layer 153b. The second electrode E2 is electrically connected to the second p-type semiconductor layer 151b via the second inner electrode IE2.

Although schematically illustrated in the drawings, since the p-type semiconductor layer 151 may include an electron-blocking layer (EBL) to reduce the amount of carriers leaking from the active layer 152. Thus, according to another exemplary embodiment, the first electrode E1 may be connected to the first inner electrode IE1 through the first contact hole CNT1 while being directly disposed on the surface of the p-type semiconductor layer 151 without the insulation film PAS. However, within the first contact hole CNT1, the first inner electrode IE1 is insulated from the p-type semiconductor layer 151 by the insulation film PAS.

The first electrode E1 is connected to a drain electrode DE or a source electrode SE of a driving transistor T2, while the second electrode E2 is connected to a common power line CPL.

The above-described first electrode E1 may be referred to as a p-type electrode or an anode, while the above-described second electrode E2 may be referred to as an n-type electrode or a cathode.

The LED device 150 may be a microscopic device having a width of 10 μm to 100 μm along the X axis and a height of 6 μm or less along the Y axis. When the LED device 150, i.e. a microscopic device having the above-described width and height, is disposed on the substrate 110, the LED device 150 may be inverted, in consideration of the width and axes thereof. However, even in the case in which the LED device 150 is disposed in an inverted position, light can be emitted from the zone Z1 or the zone Z2, thereby minimizing defects that would otherwise occur while the LED device 150 is being disposed.

Each of the first and second electrodes E1 and E2 according to an exemplary embodiment may be made of a material containing at least one selected from among, but not limited to, metal materials, such as Au, W, Pt, Si, Ir, Ag, Cu, Ni, Ti, and Cr, and alloys thereof. Each of first and second electrodes E1 and E2 according to another exemplary embodiment may be made of a transparent conductive material. The transparent conductive material may be, but is not limited to, ITO or IZO.

The insulation film PAS according to an exemplary embodiment may be made of $SiO_2$ or the like. The insulation film PAS may be disposed to cover the entirety of the LED device 150, thereby preventing the p-type semiconductor layer 151, the active layer 152, and the n-type semiconductor layer 153 from being exposed externally.

In addition, the insulation film PAS may be disposed to surround the first and second electrodes E1 and E2, such that the first and second electrodes E1 and E2 are not exposed externally. This can consequently prevent the first and second electrodes E1 and E2 from being oxidized. In this case, the insulation film PAS may have open areas in portions in which the first and second electrodes E1 and E2, the pixel electrode PE, and the common electrodes CE are electrically connected.

As an additional embodiment, the p-type semiconductor layer 151, the active layer 152, and the n-type semiconductor layer 153 may be sequentially layered on a semiconductor substrate. The semiconductor substrate may be a semiconductor material, such as a sapphire substrate or a silicon substrate. After the semiconductor substrate is used as a growth substrate for growing the p-type semiconductor layer 151, the active layer 152, and the n-type semiconductor layer 153 thereon, the semiconductor substrate may be separated in a substrate separation process. The substrate separation process may be laser lift-off, chemical lift-off, or the like. Since the growth substrate is removed from the LED device 150, as described above, the LED device 150 can have a reduced thickness so as to be accommodated in each subpixel SP.

Figure 9A:
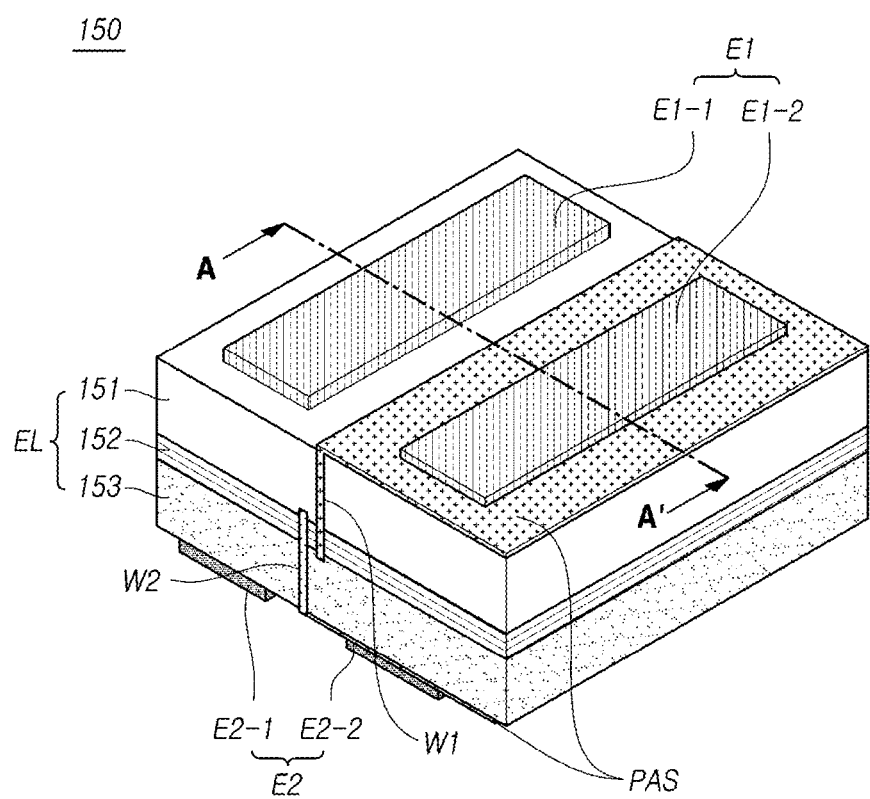
FIG. 9A is a schematic perspective view illustrating a light-emitting device according to another exemplary embodiment.
Figure 9B:
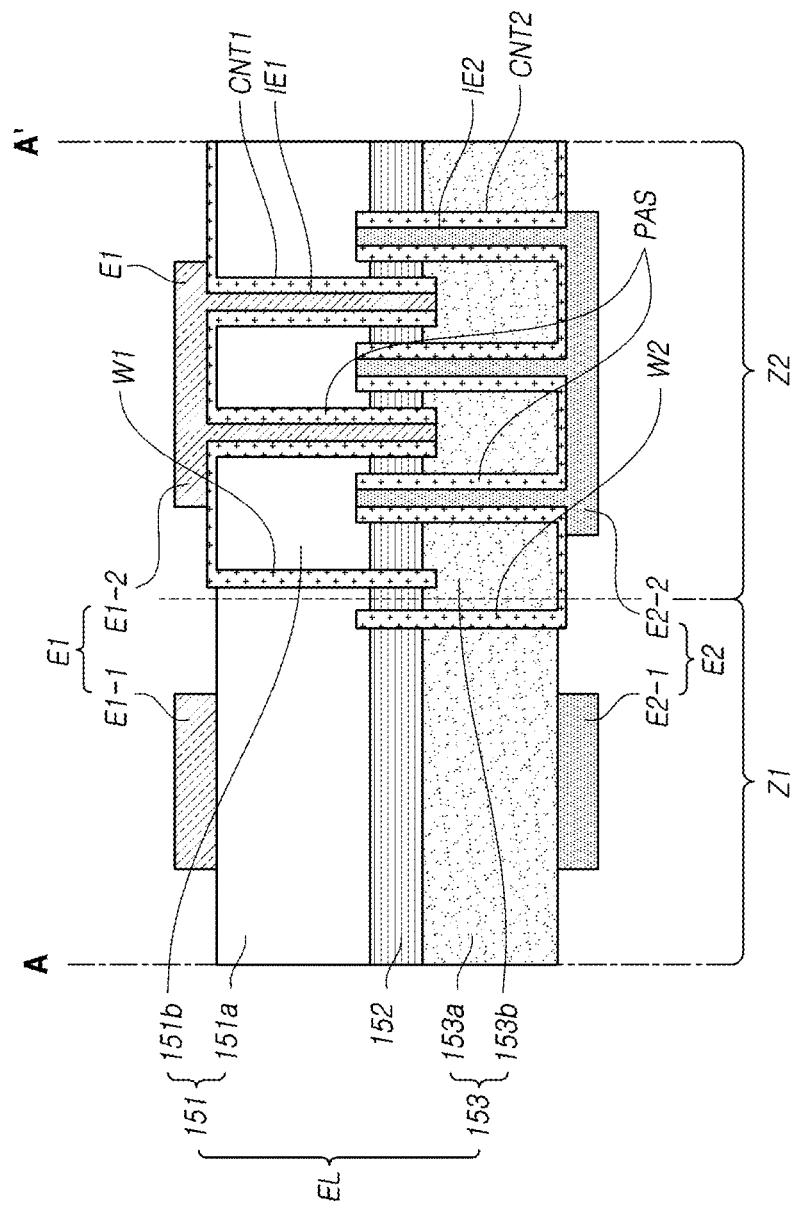
FIG. 9B is a schematic cross-sectional view of the light-emitting device illustrated in FIG. 9A, taken along line A-A' in FIG. 9A.

FIG. 9A is a schematic perspective view illustrating a light-emitting device according to another exemplary embodiment, and FIG. 9B is a schematic cross-sectional view of the light-emitting device illustrated in FIG. 9A, taken along line A-A' in FIG. 9A.

The following description will be provided with reference to FIGS. 9A and 9B, in conjunction with the foregoing drawings. Since some components are similar to those described above or can be understood from the description of the foregoing drawings, descriptions thereof will be omitted.

Referring to FIGS. 9A and 9B, a p-type semiconductor layer 151 of an LED device 150 includes a first p-type semiconductor layer 151a and a second p-type semiconductor layer 151b, which are divided and insulated from each other by a first wall W1. A first p-type electrode E1-1 is disposed on the first p-type semiconductor layer 151a. A second p-type electrode E1-2 is disposed on the second p-type semiconductor layer 151b to be insulated from the second p-type semiconductor layer 151b by an insulation film PAS, and is electrically connected to a second n-type semiconductor layer 153b through a first inner electrode IE1 of a first contact hole CNT1.

In addition, the n-type semiconductor layer 153 of the LED device 150 includes a first n-type semiconductor layer 153a and the second n-type semiconductor layer 153b, which are divided and insulated by a second wall W1. A first n-type electrode E2-1 is disposed on the first n-type semiconductor layer 153a. A second n-type electrode E2-2 is disposed on the second n-type semiconductor layer 153b to be insulated from the second n-type semiconductor layer 153b by an insulation film PAS, and is electrically connected to the second p-type semiconductor layer 151b through a second inner electrode IE2 of a second contact hole CNT2.

As described above, the first electrodes E1 and the second electrodes E2 are disposed on the semiconductor layers divided and insulated from each other by the first wall W1 and the second wall W2. Specifically, the first electrodes E1 and the second electrodes E2 are electrically connected to the first p-type semiconductor layer 151a, the second p-type semiconductor layer 151b, the first n-type semiconductor layer 153a, and the second n-type semiconductor layer 153b, and the first electrodes E1 are separated from the second electrodes E2.

In the above-described configuration, the first p-type semiconductor layer 151a and the first n-type semiconductor layer 153a corresponding to the first zone Z1 generate light using electrons and holes supplied from the first p-type electrode E1-1 and the first n-type electrode E2-1. Light is generated when a forward bias is applied to the first p-type electrode E1-1 and the first n-type electrode E2-1, while current is blocked when a reverse bias is applied to the first p-type electrode E1-1 and the first n-type electrode E2-1.

In addition, the second p-type semiconductor layer 151b and the second n-type semiconductor layer 153b corresponding to the second zone Z2 generate light using electrons and holes supplied from the second p-type electrode E1-2 and the second n-type electrode E2-2. Light is generated when a reverse bias is applied to the second p-type electrode E1-2 and the second n-type electrode E2-2, while current is blocked when a forward bias is applied to the second p-type electrode E1-2 and the second n-type electrode E2-2.

Unlike the configuration described with reference to FIGS. 8A and 8B, according to the configuration illustrated in FIGS. 9A and 9B, the first electrodes E1 are configured as segments and the second electrodes E2 are configured as segments. When the directions of voltages applied are adjusted, depending on the semiconductor layers to which the electrodes are connected, light generation and current blocking in the first zone Z1 and the second zone Z2 can be adjusted. A variety of embodiments thereof will be described later.

Figure 10A:
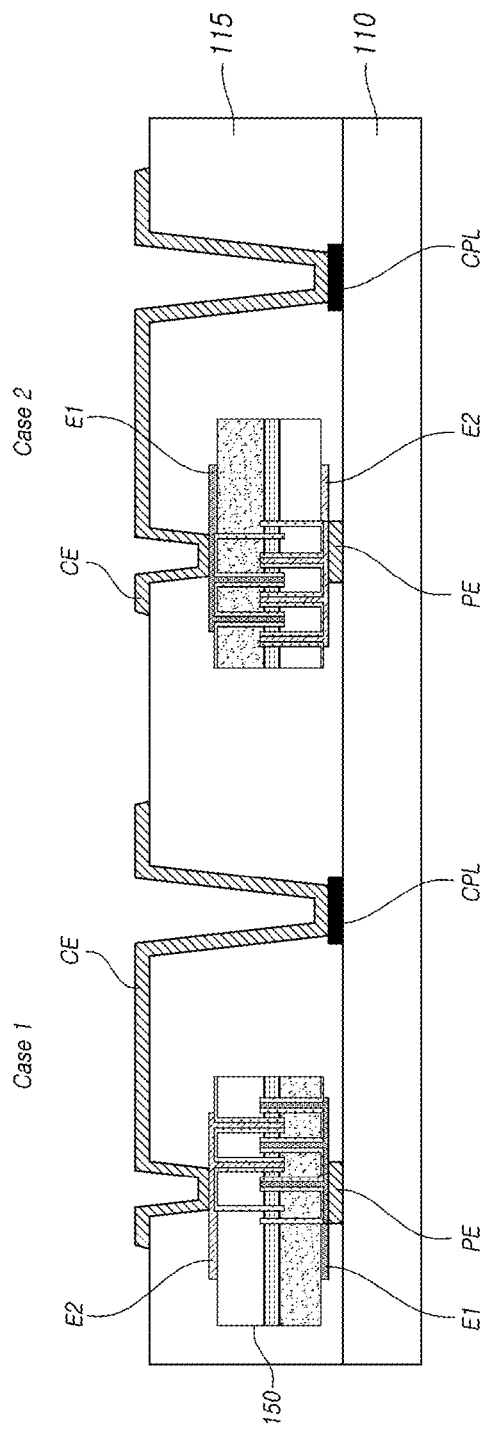
FIGS. 10A and 10B are schematic cross-sectional views illustrating a variety of applications of a light-emitting device according to exemplary embodiments.
Figure 10B:
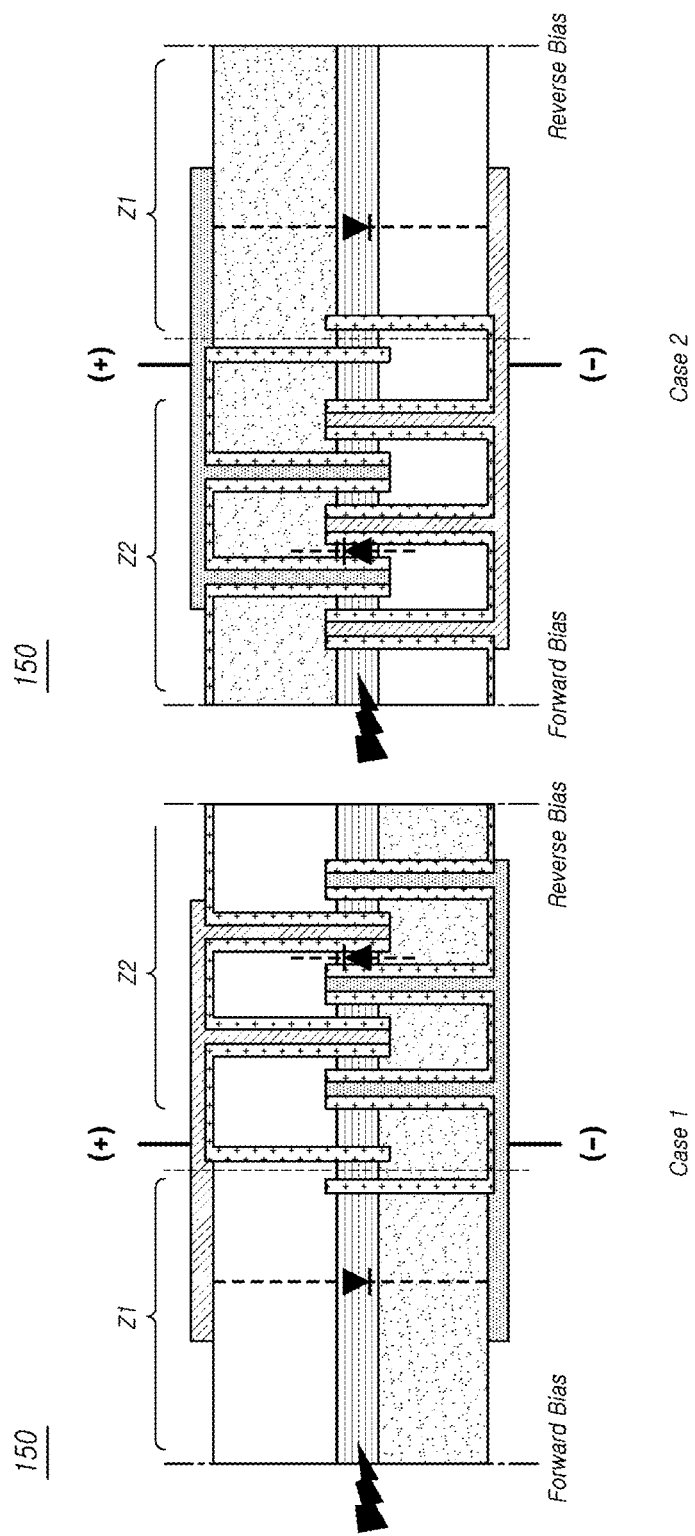

FIGS. 10A and 10B are schematic cross-sectional views illustrating a variety of applications of a light-emitting device according to exemplary embodiments.

In FIGS. 10A and 10B, some components, such as the thin-film transistor, described above with reference to the foregoing drawings, are removed. In the following description, when some components are described above with reference to the foregoing drawings, descriptions thereof will be omitted.

Referring to FIGS. 10A and 10B, LED devices 150 are disposed on a substrate 110. The LED devices 150 may be disposed such that each of first and second electrodes E1 and E2 is oriented in different directions, as in Case 1 and Case 2.

Considering the height and width of the LED device 150 in the foregoing description, the arrangements of Case 1 and Case 2 will be most typical. In each of Case 1 and Case 2, the function of light generation and the function of current blocking of a first zone Z1 and a second zone Z2 may be exchanged, depending on the directions of current applied to a pixel electrode PE and a common electrode CE.

Detailed descriptions will be provided regarding Case 1 and Case 2. In Case 1, when holes are supplied to the first electrode E1 and electrons are supplied to the second electrode E2, light is generated in the first zone Z1 in response to a forward bias applied thereto, while current is blocked in the second zone Z2 in response to a reverse bias applied thereto.

In Case 2, unlike Case 1, current is blocked in the first zone Z1 in response to a reverse bias applied thereto, while light is generated in the second zone Z2 in response to a forward bias applied thereto.

Accordingly, even in the case in which the LED device 150 is disposed in an inverted position, the electrodes can be connected properly and light can be generated properly.

Figure 11A:
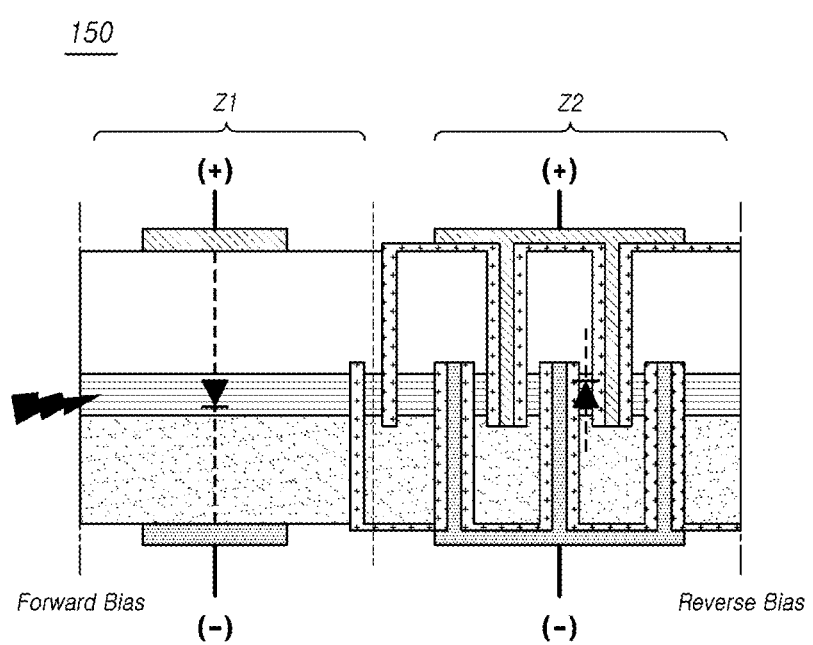
FIGS. 11A to 11C are schematic cross-sectional views illustrating a variety of applications of a light-emitting device according to exemplary embodiments.
Figure 11B:
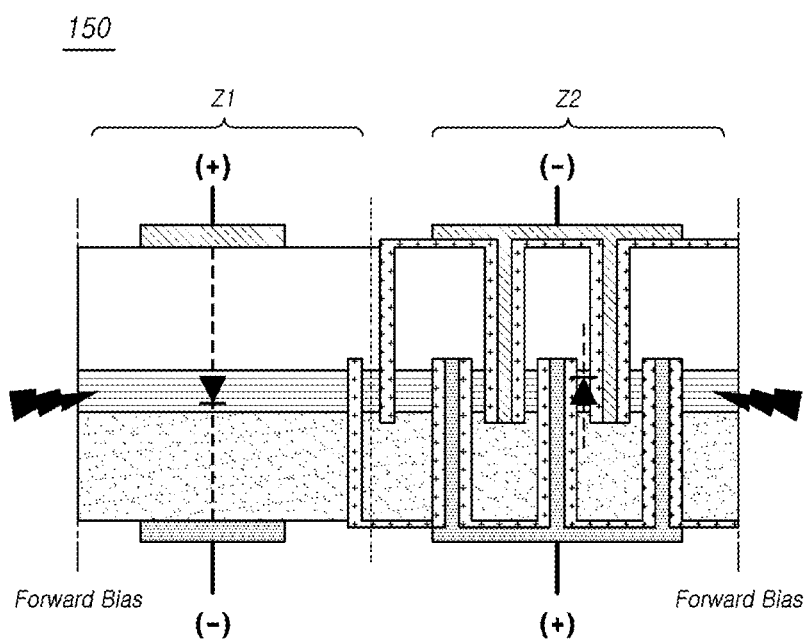
Figure 11C:
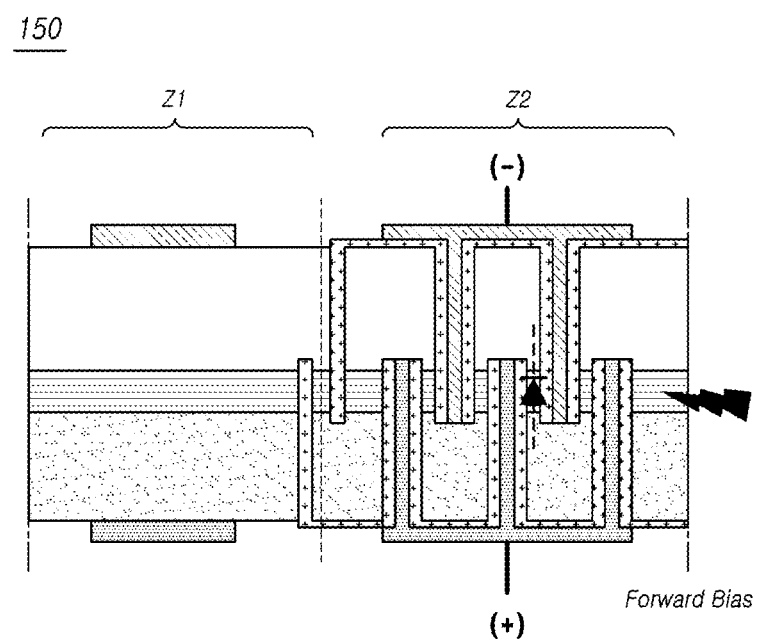

FIGS. 11A to 11C are schematic cross-sectional views illustrating a variety of applications of a light-emitting device according to exemplary embodiments.

As described above regarding the configurations illustrated in FIGS. 9A and 9B, when the first electrodes E1 and the second electrodes E2 connected to the first zone Z1 and the second zone Z2 are configured as segments depending on the semiconductor layers to which the electrodes are connected, the LED device 150 may have a variety of applications as follows.

When the electrodes are connected such that current is applied to the first zone Z1 and the second zone Z2 in the same direction, as illustrated in FIG. 11A, one zone acts as a light-emitting zone, while the other zone acts as an inactive zone to block current. Accordingly, the LED device 150 can act as a light-emitting device that can generate light, regardless of how the LED device 150 is disposed. In addition, the energy level of an unintended flow of current, i.e. reverse current, can be lowered. Accordingly, the LED device 150 can act as a protective circuit to protect internal devices or the like.

In Case 2 illustrated in FIG. 11B, the electrodes are disposed such that current is applied to the first zone Z1 and the second zone Z2 in different directions. When current is applied in different directions, both the first zone Z1 and the second zone Z2 can generate light, thereby realizing higher luminosity than the case in which one of the first zone Z1 and the second zone Z2 generates light. Accordingly, the LED device 150 can provide a high-contrast display device.

In Case 3 illustrated in FIG. 11C, the first zone Z1 and the second zone Z2 are set to have independent electrode structures, and one of the first zone Z1 and the second zone Z2 is set as a dummy zone. When the first zone Z1 is damaged or fails to generate light, it is possible to repair a defective pixel by a circuit control method, a laser-based electrode connection method, or the like.

In addition to the above-described applications, the LED device 150 can be used in a variety of other applications, depending on a variety of circuit connections.

The connection of electrodes E1 and E2 located on the bottom portions of the LED device 150 may be carried out using a method of melting the butted surfaces of the electrodes using high-temperature heat generated by electrical resistance against current supplied to the adjoined electrodes so that the contact portions of the two electrodes are welded or a method of melting and welding the surfaces of the electrodes connected to the LED device 150, on the bottom surface of the substrate 110, using a laser beam.

In the above-described configuration, the common power line CPL connected to the common electrode CE may be a power line for supplying electrons, or may be a power line for supplying holes according to another configuration. Such configurations may be selected by a person having ordinary skill in the art. Regarding the thin-film transistor, the above-described configuration may vary depending on whether the thin-film transistor is a p-type metal-oxide-semiconductor (PMOS) transistor or an n-type metal-oxide-semiconductor (NMOS) transistor.

It will be apparent to those skilled in the art that various modifications and variations can be made in the light-emitting device and display device using the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A light-emitting device, comprising:
   a p-type semiconductor layer, an active layer, and an n-type semiconductor layer sequentially layered on one another;
   at least one p-type electrode disposed on the p-type semiconductor layer; and
   an at least one n-type electrode disposed on the n-type semiconductor layer,
   wherein the p-type semiconductor layer comprises a first p-type semiconductor layer, a second p-type semiconductor layer, and a first wall by which the first and second p-type semiconductor layers are divided from each other,
   the n-type semiconductor layer comprises a first n-type semiconductor layer, a second n-type semiconductor layer, and a second wall by which the first and second n-type semiconductor layers are divided from each other,
   the second p-type semiconductor layer has at least one first contact hole,
   the second n-type semiconductor layer has at least one second contact hole,
   the at least one p-type electrode is insulated from the second p-type semiconductor layer, and is electrically connected to the second n-type semiconductor layer through the first contact hole, and
   the at least one n-type electrode is insulated from the second n-type semiconductor layer, and is electrically connected to the second p-type semiconductor layer through the second contact hole.

2. The light-emitting device according to claim 1, further comprising insulating films disposed in the first contact hole and the second contact hole, the insulating films being made of the same material as the first wall and the second wall.

3. The light-emitting device according to claim 2, wherein the at least one p-type electrode is electrically connected to the second n-type semiconductor layer through a first inner electrode located in the first contact hole.

4. The light-emitting device according to claim 2, wherein the at least one n-type electrode is electrically connected to the second p-type semiconductor layer through a second inner electrode located in the second contact hole.

5. The light-emitting device according to claim 2, wherein the insulating films is further disposed between the p-type electrode and the second p-type semiconductor layer and between the n-type electrode and the second n-type semiconductor layer.

6. The light-emitting device according to claim 1, wherein the at least one n-type electrode comprises a first n-type electrode and a second n-type electrode, the first n-type electrode being electrically connected to the first n-type semiconductor layer, and the second n-type electrode being electrically insulated from the second n-type semiconductor layer.

7. The light-emitting device according to claim 1, wherein a part of the n-type electrode is disposed on an area where the first n-type semiconductor layer is disposed and the other part of the n-type electrode is disposed on an area where the second n-type semiconductor layer is disposed.

8. The light-emitting device according to claim 1, wherein a portion of at least one of the first wall and the second wall is disposed inside the active layer.

9. The light-emitting device according to claim 1, wherein at least one of the first wall and the second wall pass through the active layer.

10. The light-emitting device according to claim 1, wherein a portion of the active layer is separated by the first wall and the second wall.

11. The light-emitting device according to claim 1, wherein a portion of the first wall and a portion of the second wall are overlapped laterally.

* * * * *